United States Patent [19]

Hacker

[11] Patent Number: 4,716,354
[45] Date of Patent: Dec. 29, 1987

[54] AUTOMATIC VOLTAGE REGULATOR MEANS PROVIDING A DUAL LOW POWER RESPONSIVE AND OUTPUT-VOLTAGE-CONTROLLING REGULATOR SIGNAL PARTICULARLY FOR A PLURAL SOURCE BATTERY POWERED SYSTEM

[75] Inventor: David C. Hacker, Cedar Rapids, Iowa

[73] Assignee: Norand Corporation, Cedar Rapids, Iowa

[21] Appl. No.: 797,235

[22] Filed: Nov. 12, 1985

[51] Int. Cl.⁴ .............................................. H02J 7/04
[52] U.S. Cl. ...................................... 320/39; 323/303
[58] Field of Search ................... 323/299, 303; 320/2, 320/39

[56] References Cited

U.S. PATENT DOCUMENTS

| | | | |
|---|---|---|---|
| 3,754,182 | 8/1973 | Morris et al. | 323/299 |
| 4,203,105 | 5/1980 | Osada et al. | 340/636 |
| 4,308,492 | 12/1981 | Mori et al. | 320/35 |
| 4,455,523 | 6/1984 | Koenck | 320/43 |
| 4,494,064 | 1/1985 | Harkness | 323/303 |
| 4,553,081 | 11/1985 | Koenck | 320/43 |

*Primary Examiner*—Patrick R. Salce
*Assistant Examiner*—Anita M. Ault
*Attorney, Agent, or Firm*—Neuman, Williams, Anderson & Olson

[57] ABSTRACT

In an exemplary embodiment, a battery conditioning system monitors battery conditioning and includes a memory for storing data based thereon; for example, data may be stored representative of available battery capacity as measured during a deep discharge cycle. With a microprocessor monitoring battery operation of a portable unit, a measure of remaining battery capacity can be calculated and displayed. Where the microprocessor is permanently secured to the battery so as to receive operating power therefrom during storage and handling, the performance of a given battery in actual use can be accurately judged since the battery system can itself maintain a count of accumulated hours of use and other relevant parameters. Where an embodiment includes a main battery and a backup battery, the voltage of each may be individually measured, and each may be conditioned. Battery capacity of each may be measured. In a unique low voltage sensing circuit applicable to power sources generally, an automatic voltage regulator may itself sense a low power condition without requiring additional precision components. As an example only, such detected low power condition may be utilized to effect switch over to a backup battery or other auxiliary power supply.

44 Claims, 19 Drawing Figures

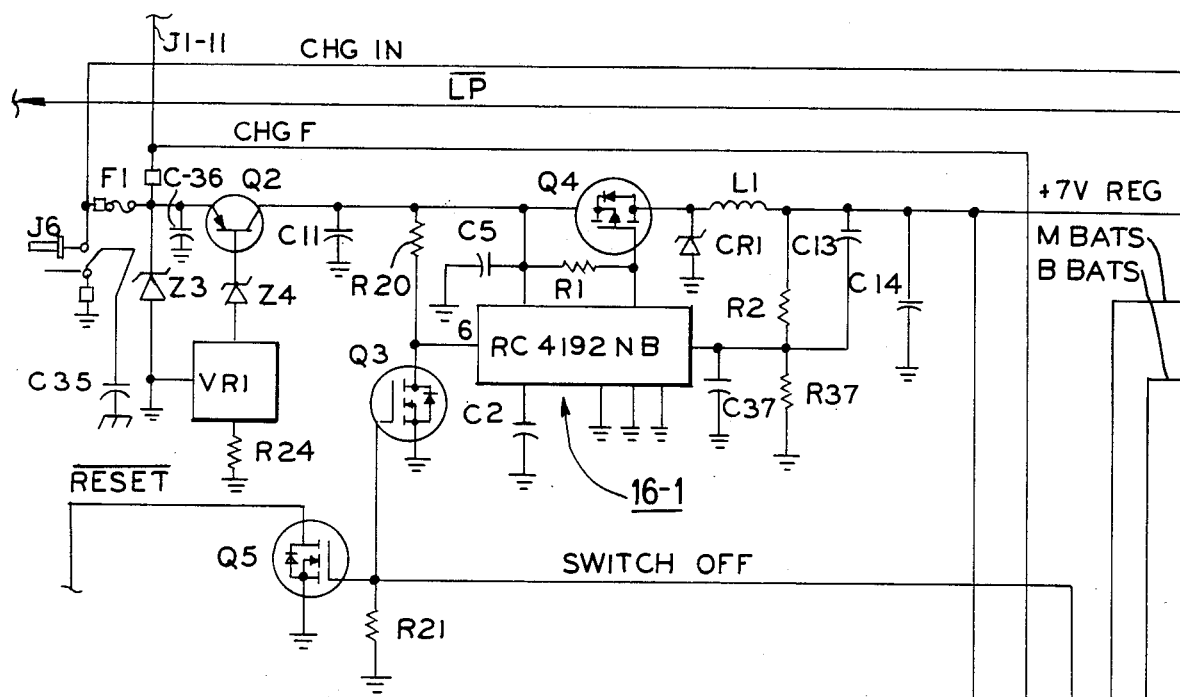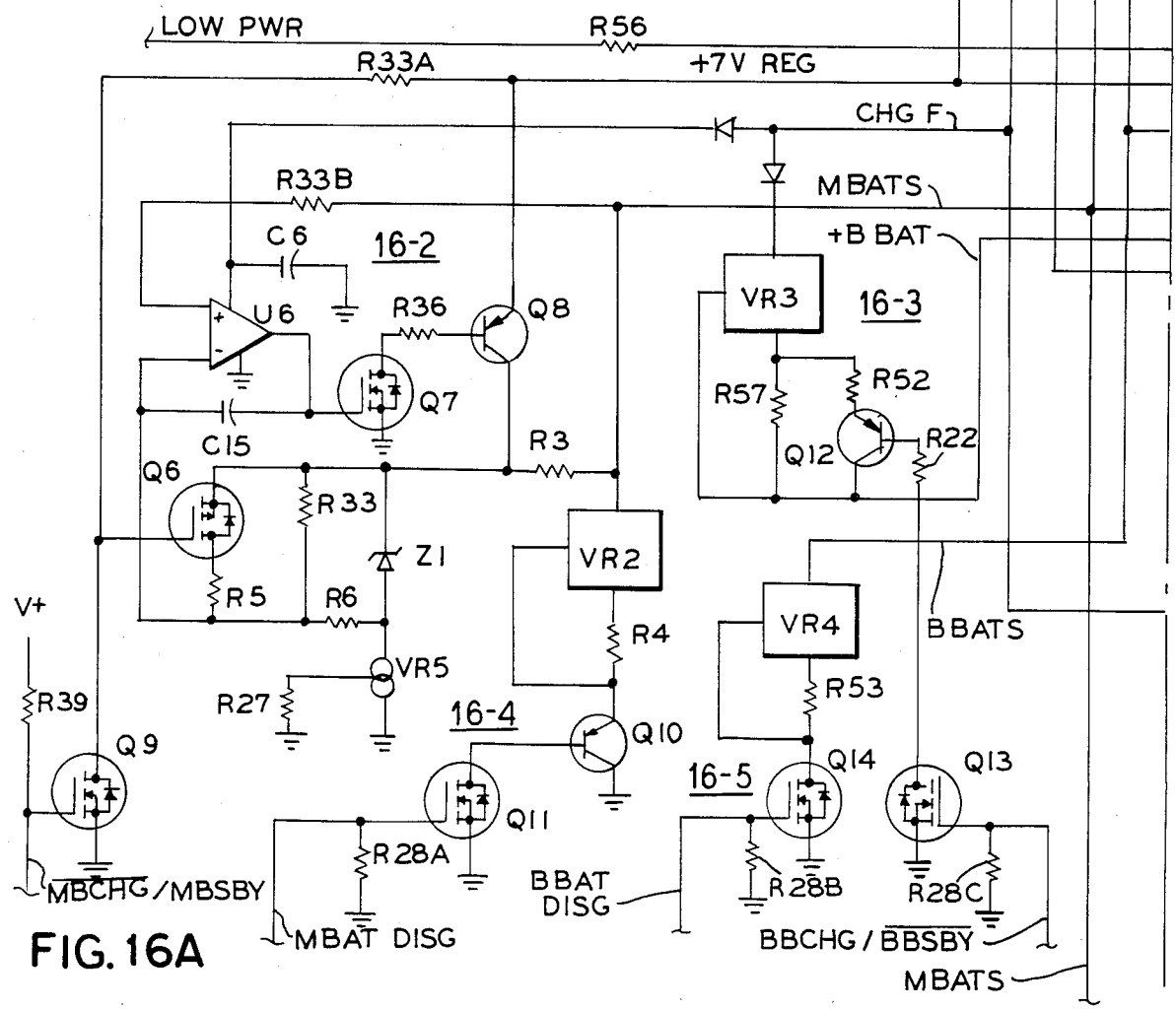
FIG. 16A

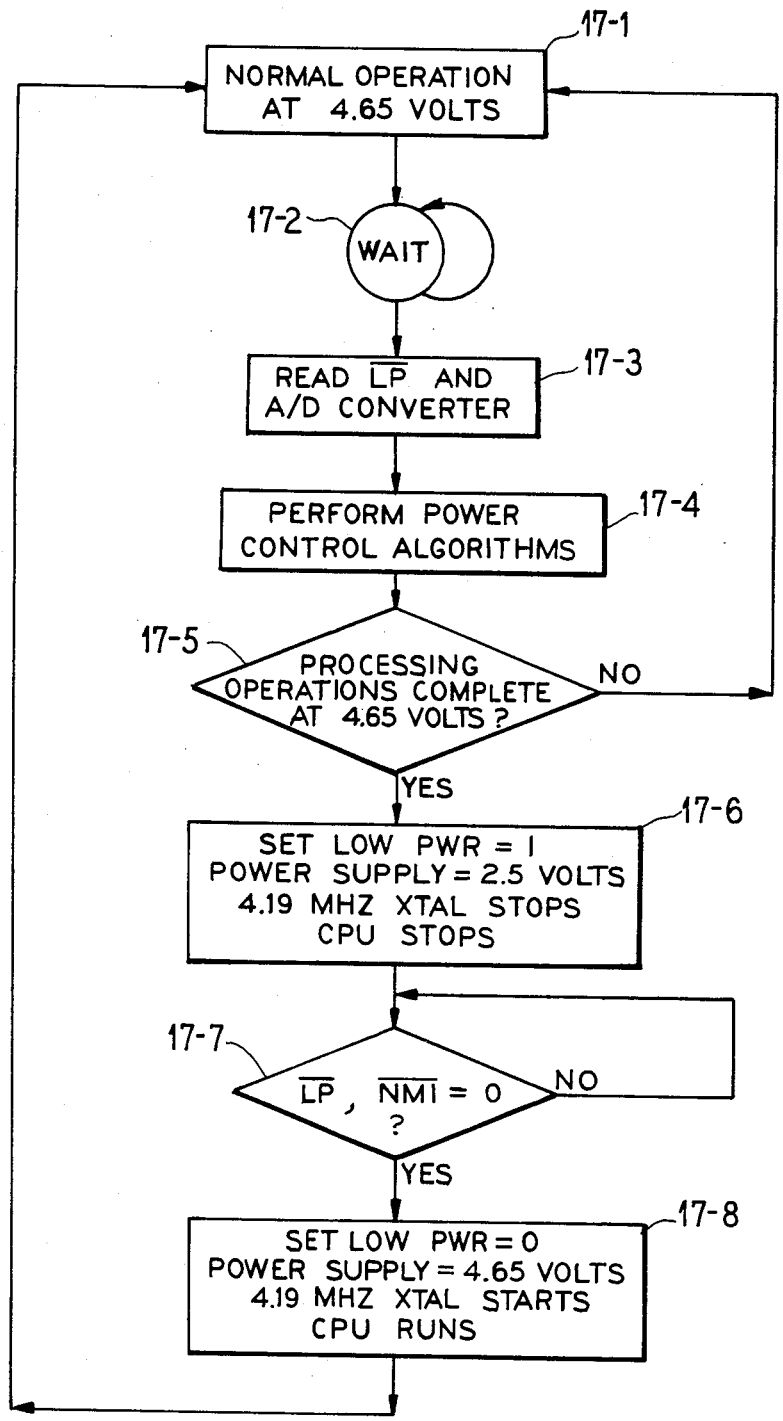

AUTOMATIC VOLTAGE REGULATOR MEANS PROVIDING A DUAL LOW POWER RESPONSIVE AND OUTPUT-VOLTAGE-CONTROLLING REGULATOR SIGNAL PARTICULARLY FOR A PLURAL SOURCE BATTERY POWERED SYSTEM

CROSS-REFERENCE TO RELATED APPLICATIONS

Reference is made pursuant to 35 USC 120 to a copending application in the name of Steven E. Koenck, U.S. Ser. No. 612,588 filed May 21, 1984, now issued as U.S. Pat. No. 4,553,081 on Nov. 12, 1985, and to an application which was copending with application Ser. No. 612,588, namely Steven E. Koenck U.S. Ser. No. 385,830 filed June 7, 1982, which issued as U.S. Pat. No. 4,455,523 on June 19, 1984. The disclosures and drawings of these Koenck U.S. Pat. Nos. 4,455,523 and 4,553,081 are hereby incorporated herein by reference in their entirety.

BACKGROUND OF THE INVENTION

The present invention relates to portable battery powered systems and particularly to a battery system for portable devices capable of optimizing the performance of a rechargeable electrochemical storage medium while at the same time maximizing its useful life.

Portable computerized systems are presently being extensively utilized in a wide range of applications. For example, such systems may be utilized in delivery vehicles which are to be away from a central warehouse or the like for a major part of each working day. Recharging operations may take place in locations subject to extremes of temperature. It is particularly crucial to avoid an equipment failure where a portable device is a vital link to the completion of scheduled tasks at remote locations and the like. In such circumstances a loss of adequate battery power can be just as detrimental as any other malfunction.

SUMMARY OF THE INVENTION

It is a basic objective of the present invention to provide a portable battery powered system of increased reliability and useful life.

An important feature of the invention resides in the provision of a portable system wherein the user can obtain a relatively accurate indication of the battery energy remaining available for use at any time during a portable operating cycle. Further, the user can be automatically alerted when battery capacity diminishes to a selected value, or when battery output voltage is at a selected marginal level.

For the sake of recharging of a battery system as rapidly as possible without detriment to an optimum useful life span, battery parameters including battery temperature can be monitored during a charging cycle and the battery charging current can be adjusted accordingly.

Since a battery may deteriorate when subjected to repeated shallow discharge and recharging cycles, according to the present invention, a count of such shallow charge cycles may be automatically maintained throughout the operating life of the battery system, such that deep discharge cycles may be effected as necessary to maintain desired performance standards.

Furthermore, according to another highly significant feature of the invention, automatically operating battery monitoring and/or conditioning circuitry may be secured with the battery pack for handling as a unit therewith. The monitoring circuitry may receive its operating power from the battery pack during storage or handling such that a total history of the battery pack may be retained for example in a volatile memory circuit where such type of memory otherwise provides optimum characteristics for a portable system. The conditioning circuitry may have means for effecting a deep discharge cycle, and concomitantly with the deep discharge cycle, a measure of actual battery capacity may be obtained. From such measured battery capacity and a continuous measurement of battery current during portable operation, a relatively accurate "fuel gauge" function becomes feasible such that the risk of battery failure during field operation can be essentially eliminated. The performance of a given type of battery in actual use can be accurately judged since the battery system can itself maintain a count of accumulated hours of use, and other relevant parameters.

In a simplified system currently in use, the conditioning system is incorporated in the portable utilization device such that the programmed processor of the utilization device may itself automatically effect a deep discharge conditioning cycle and/or a deep discharge capacity test. The deep discharge cycle may be effected at a controlled rate, such that the time for discharge from a fully charged condition to a selected discharge condition may itself represent a measure of battery capacity. Instead of directly measuring battery current during use, the programmed processor may maintain a measure of operating time and/or elapsed time during portable operation, so as to provide an indication of remaining battery capacity. A time measure of operating time may be utilized to automatically determine the time duration of the next charging cycle. When both a main battery and a backup battery are present, the operating time of each may be individually accumulated, and used to control the time duration of the respective recharging operations.

Additional features of a preferred commercial system include individual charging and discharging circuits for a main battery and a backup battery for reliable conditioning and operation of the backup battery independently of the state of the main battery. Desired parameters such as main battery voltage, backup battery voltage, ambient temperature (e.g. in the main battery case or in the battery compartment), and charging voltage may be obtained by means of an integrated circuit analog to digital converter, which thus replaces several comparators and many precision costly components of a prior implementation.

A feature generally applicable to voltage regulated power supplies resides in utilizing a regulator signal which departs markedly from its normal range as input voltage falls below a prescribed value. Such regulator signal may be utilized to switch to a different power source automatically, and/or to generate a suitable low power signal for external circuits, e.g. for controlling the issuance of a user-discernable low power warning. In a preferred implementation an operational amplifier supplies a current control signal which controls one or more current flow paths to maintain a desired regulated output voltage. A common saturation signal from the operational amplifier may result from a low power condition of any of several input sources which are connected to respective selectively activated regulator circuits. Where desired, a plurality of regulator circuits may be shifted from one setpoint voltage value to another by switching of the input circuitry of the operational amplifier, and the saturation signal will then represent a low power condition in relation to the other selected setpoint voltage value. The second regulated output voltage value may, for example, be desired in conjunction with a "power down" mode of battery powered equipment (e.g. CMOS dynamic memory circuits).

The invention will now be described, by way of example and not by way of limitation, with reference to the accompanying sheets of drawings; and other objects, features and advantages of the invention will be apparent from this detailed disclosure and from the appended claims.

BRIEF DESCRIPTION OF THE DRAWINGS

FIG. 16A shows a portion of an electric circuit diagram for illustrating preferred implementations of a direct current to direct current converter, a main battery charging circuit, a backup battery charging circuit, and main and backup discharge circuits for such commercial implementation;

FIG. 17 is a flow diagram for illustrating the manner in which the power control circuitry of FIGS. 16A and 16B interacts with components 15-19 and 15-25 of FIG. 15 during operation of a preferred portable unit under battery power.

INCORPORATION BY REFERENCE

FIGS. 1 through 11 of the present case are described in the incorporated Koenck U.S. Pat. No. 4,455,523 at column 2, line 60, to column 19, line 21.

Figure 12:
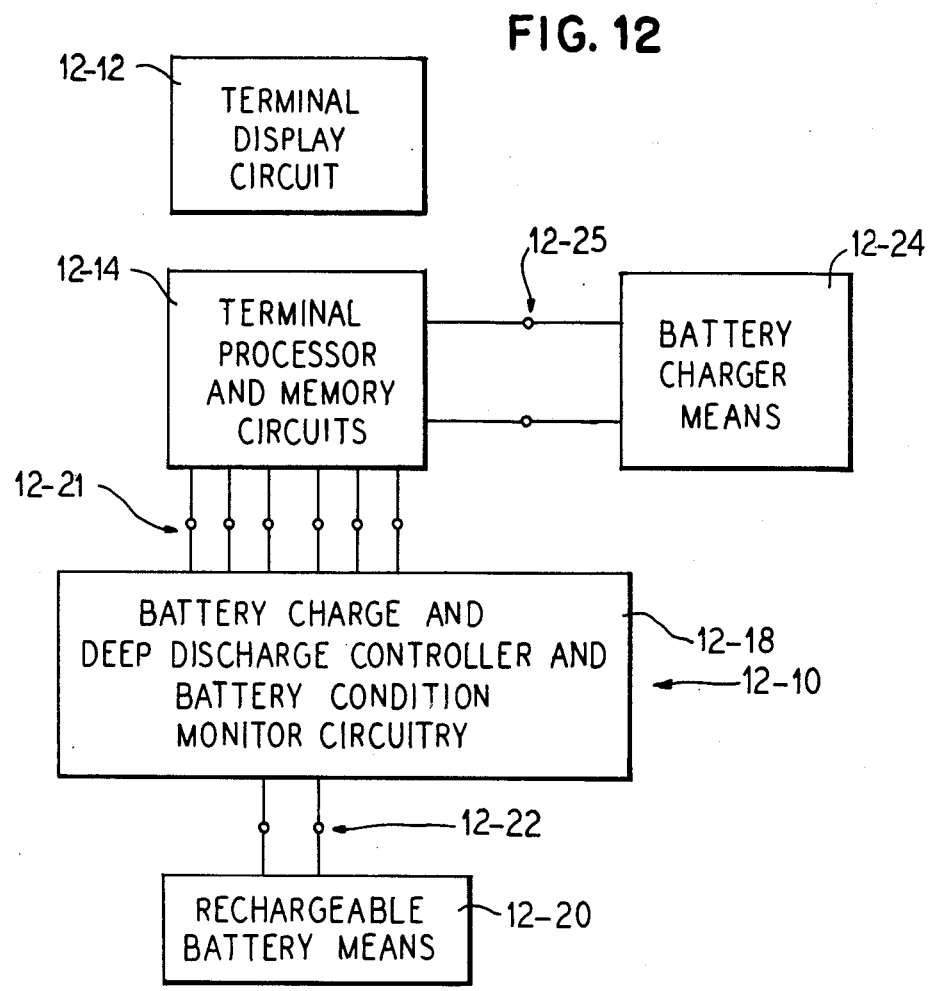
FIG. 12 is a block diagram of a simplified portable battery powered device in accordance with the present invention associated with a battery charger means, and also serves to illustrate a stationary battery conditioning system for spare battery packs.
Figure 13:
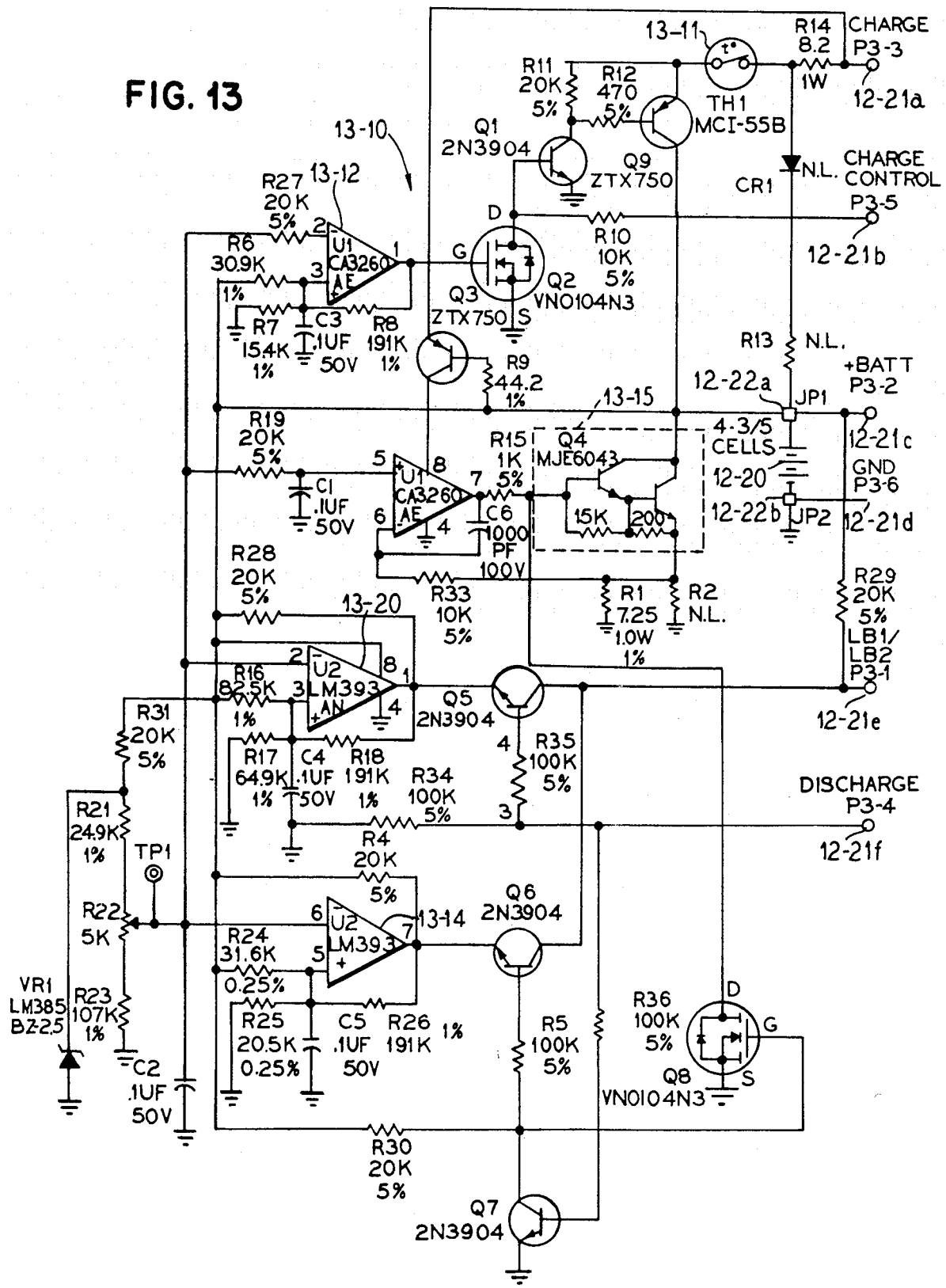
FIG. 13 shows a specific implementation of the battery charge and deep discharge controller and monitor circuitry which is represented as a labeled rectangle in FIG. 12.
Figure 14:
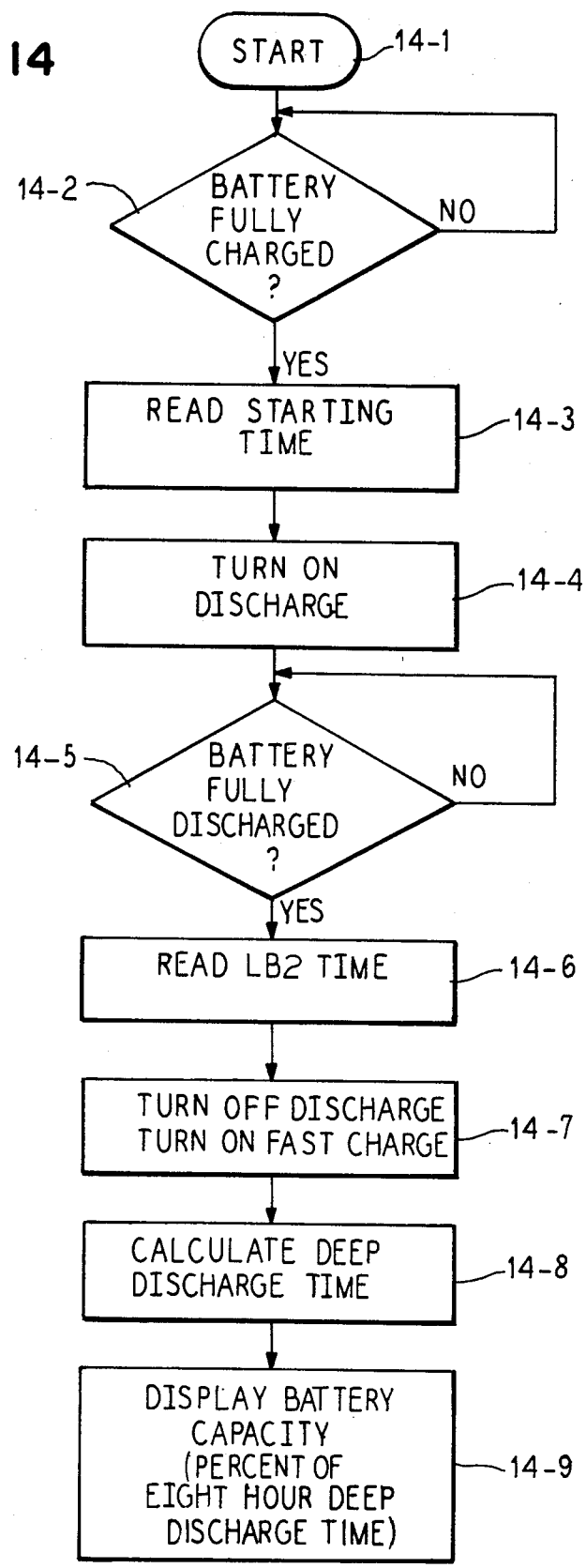
FIG. 14 is a flow diagram indicating the operating means for effecting an automatic discharge cycle with the specific circuitry of FIG. 13.

FIGS. 12, 13, and 14 are described in the incorporated Koenck U.S. Pat. No. 4,553,081 at column 17, line 58, to column 49, line 56.

DESCRIPTION OF FIGS. 15, 16A AND 16B

Figure 1:
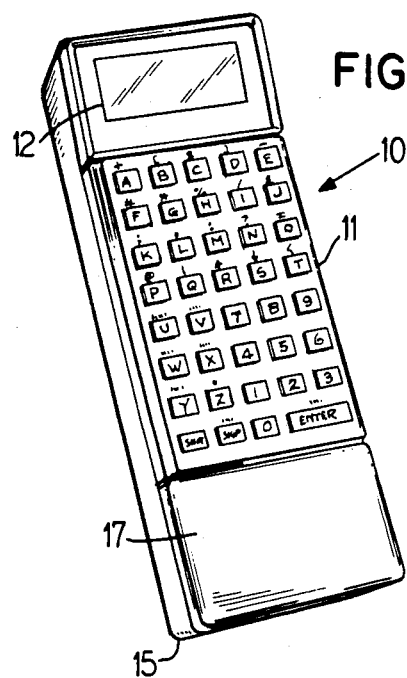
FIG. 1 is a somewhat diagrammatic perspective view of a portable battery powered device which may incorporate a battery system in accordance with the teachings and principles of the present invention.
Figure 3:
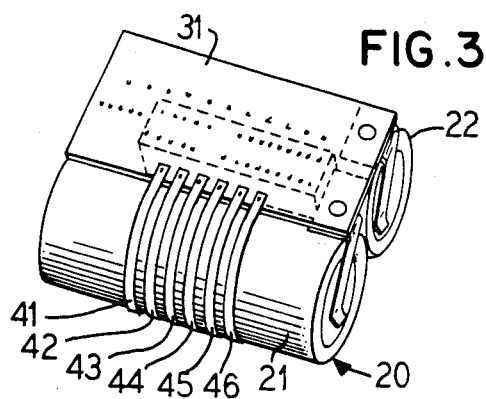
FIG. 3 is a somewhat diagrammatic perspective view of a battery system in accordance with the teachings and principles of the present invention.
Figure 4:
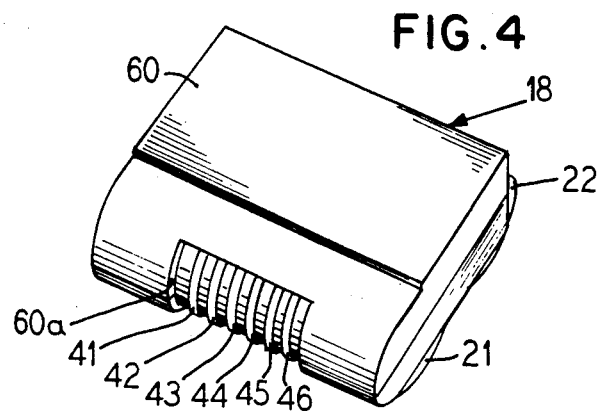
FIG. 4 is a perspective view similar to FIG. 3 but illustrating the battery system enclosed in a protective casing, to form a complete battery pack assembly for insertion into the battery compartment of the portable device, as a unit.
Figure 5:
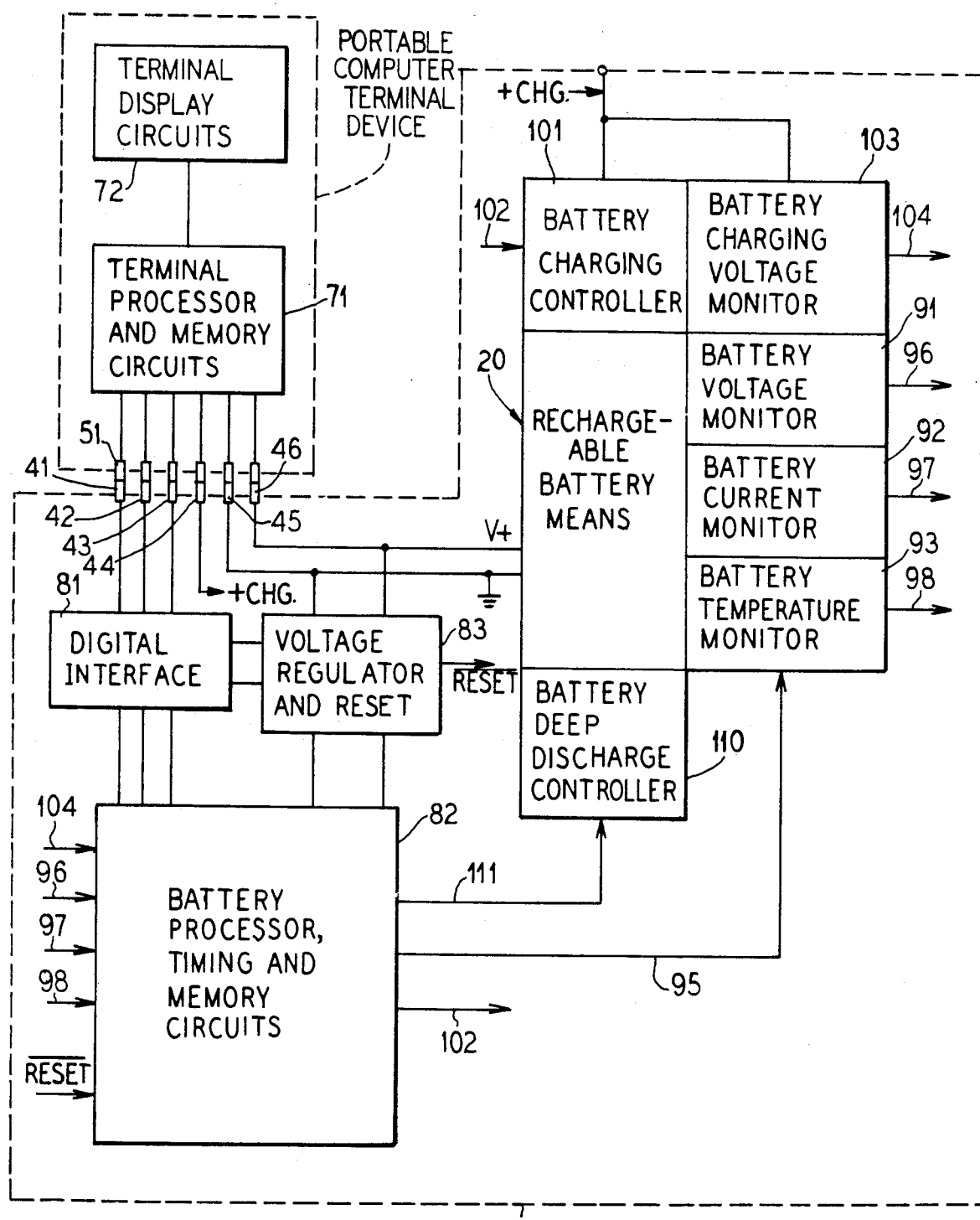
FIG. 5 shows a block diagram for explaining the cooperative relationship of the electronic parts of the particular portable computer terminal device and battery system shown in FIGS. 1 through 4, by way of example and not by way of limitation.
Figure 6:
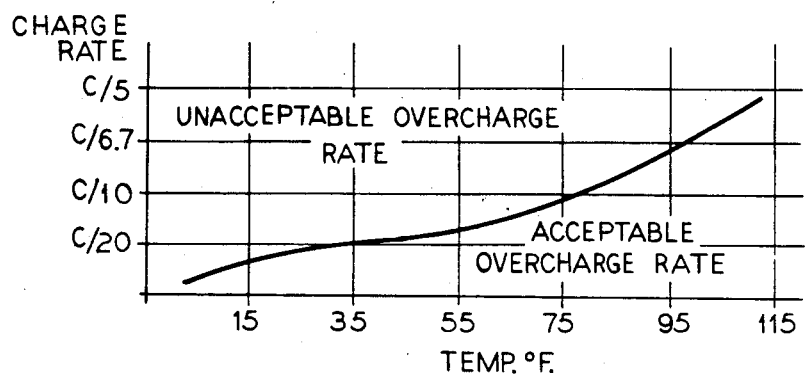
FIG. 6 shows a typical plot of permissible continuous overcharge rate as a function of temperature, for a particular type of rechargeable electrochemical energy storage cell, by way of example and not by way of limitation.
Figure 7:
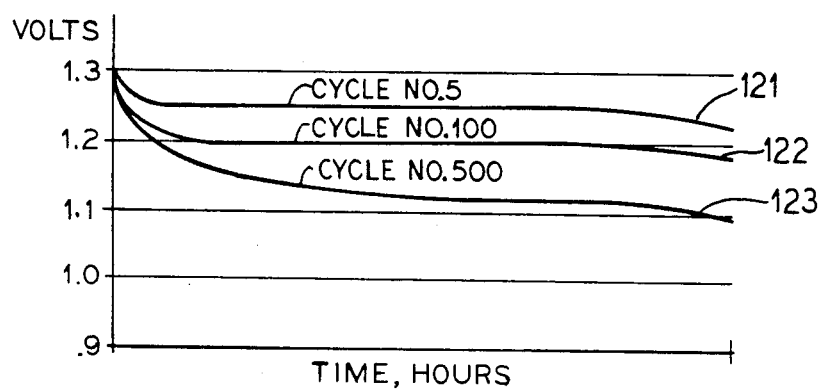
FIG. 7 is a plot of the effect of repetitive shallow cycling for the particular energy storage medium also represented by the plot of FIG. 6.
Figure 8:
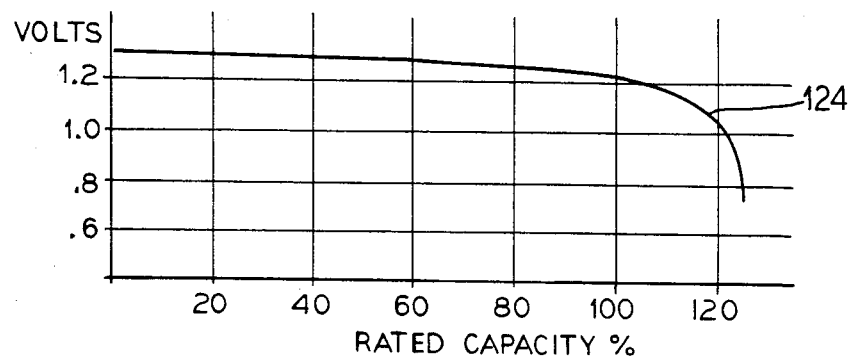
FIG. 8 is a plot of discharge characteristics for the particular energy storage medium also represented by the plots of FIGS. 6 and 7.
Figure 9A:
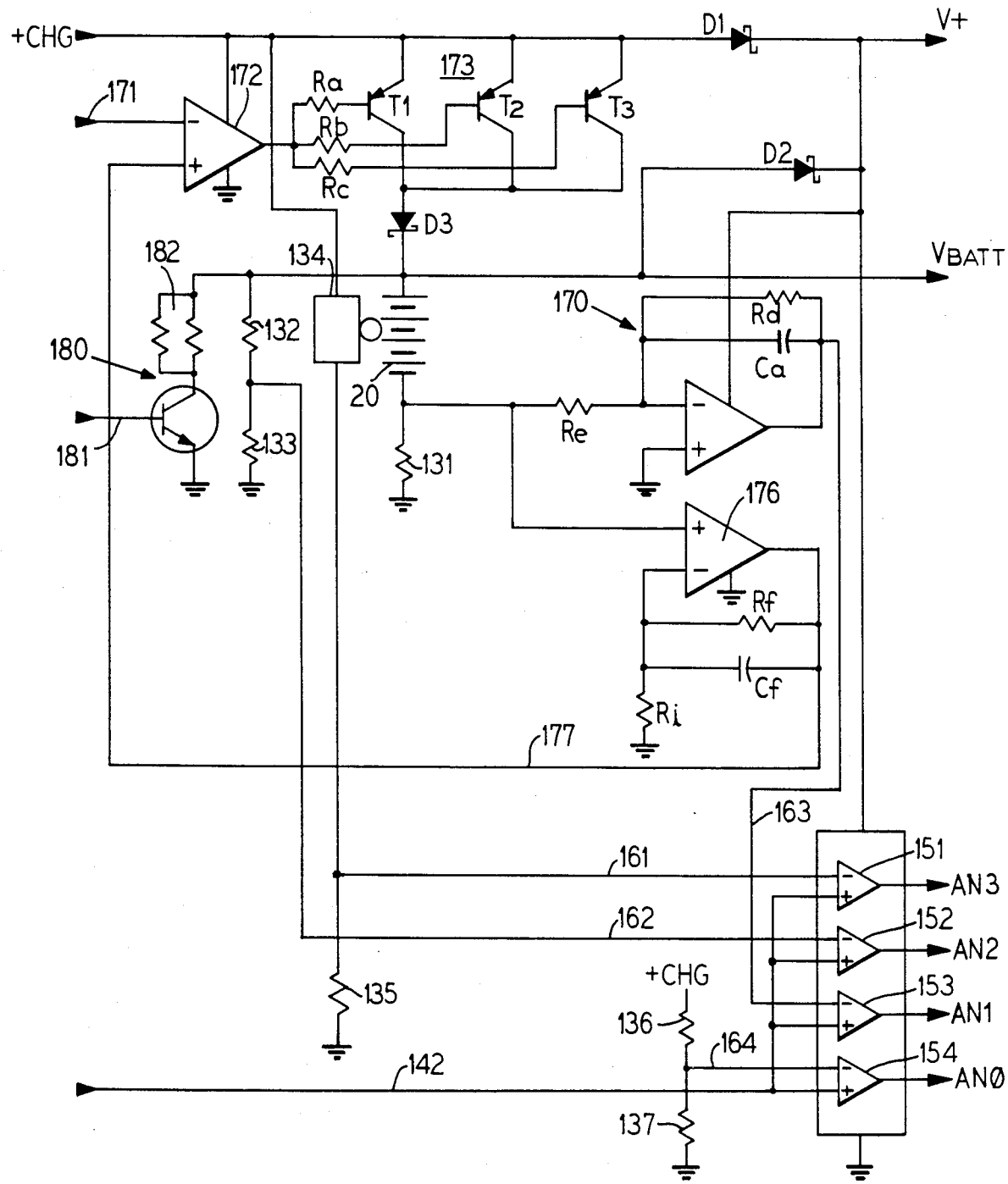
FIGS. 9A and 9B show a specific circuit implementation in accordance with the block diagram of FIG. 5, by way of example and not by way of limitation.
Figure 9B:
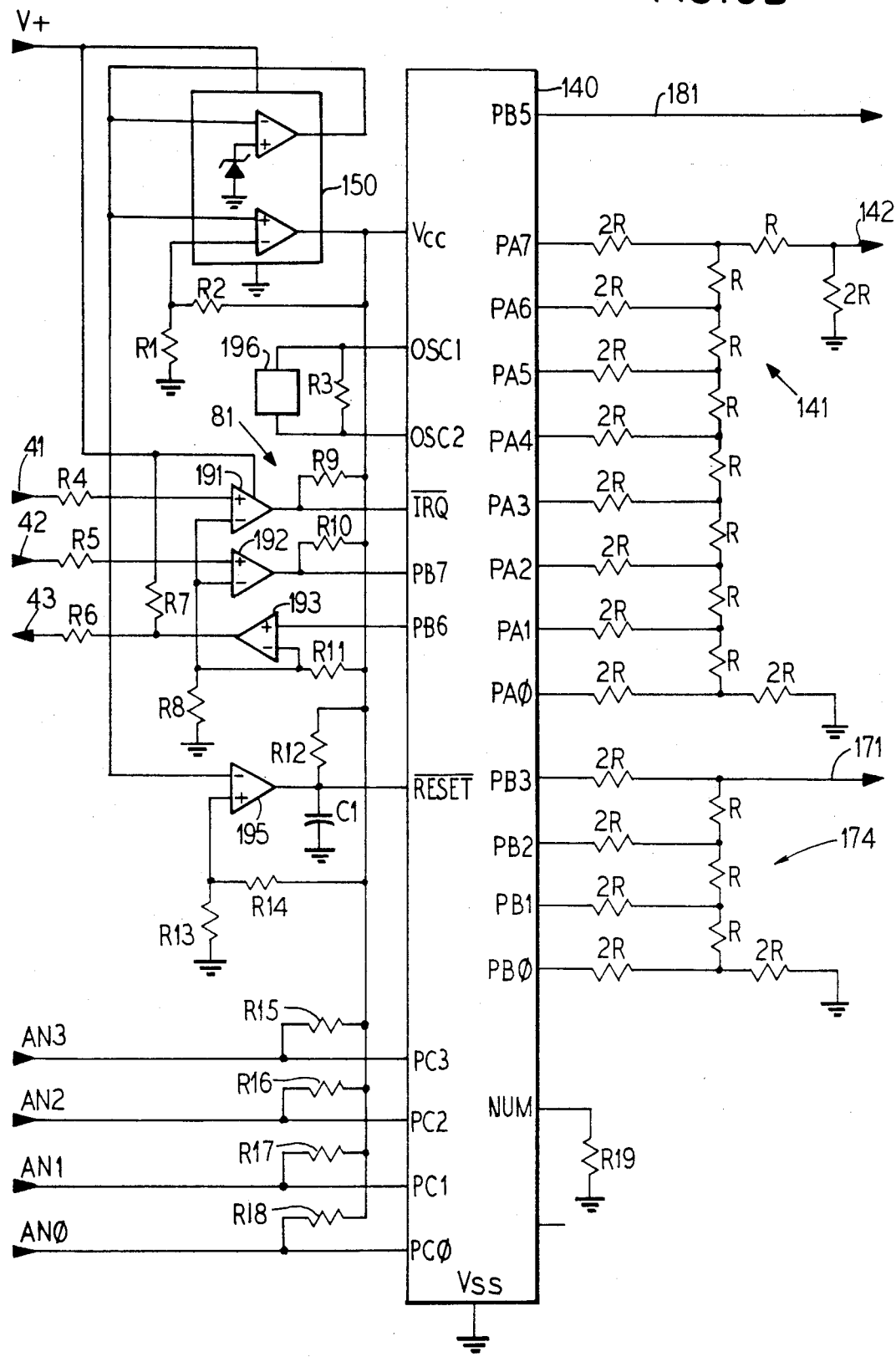
Figure 10:
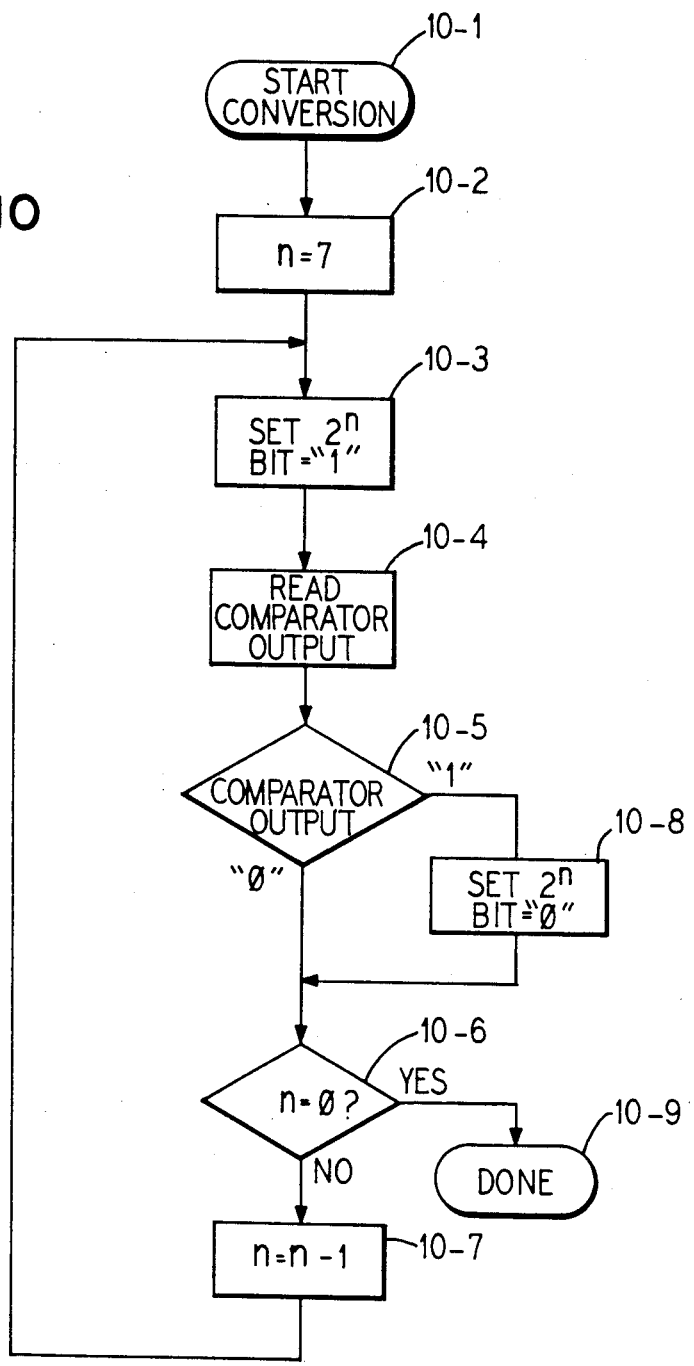
FIG. 10 is a flow diagram for illustrating an exemplary control program for carrying out analog to digital conversion of battery parameter values utilizing the particular exemplary circuit of FIGS. 9A and 9B.
Figure 11:
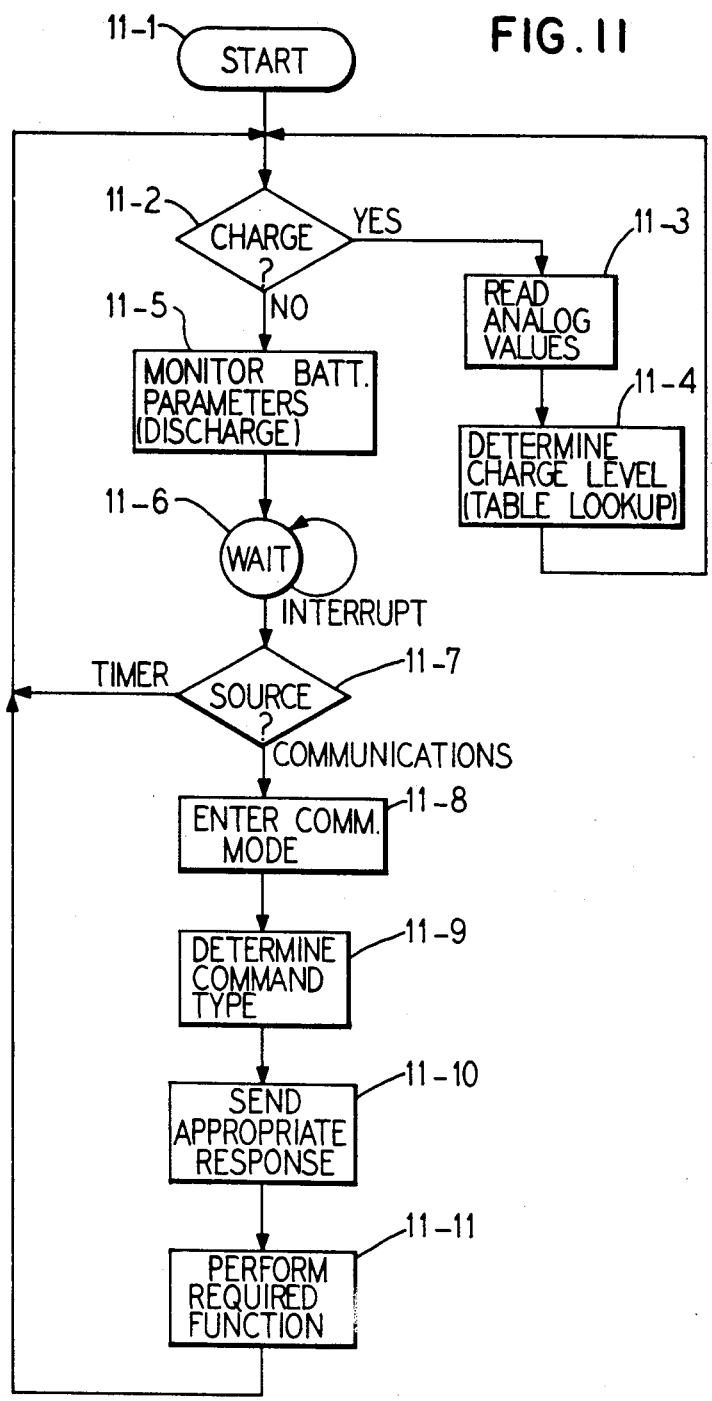
FIG. 11 is a flow diagram illustrating the general battery processor control program utilized in conjunction with simplified system currently in use.
Figure 15:
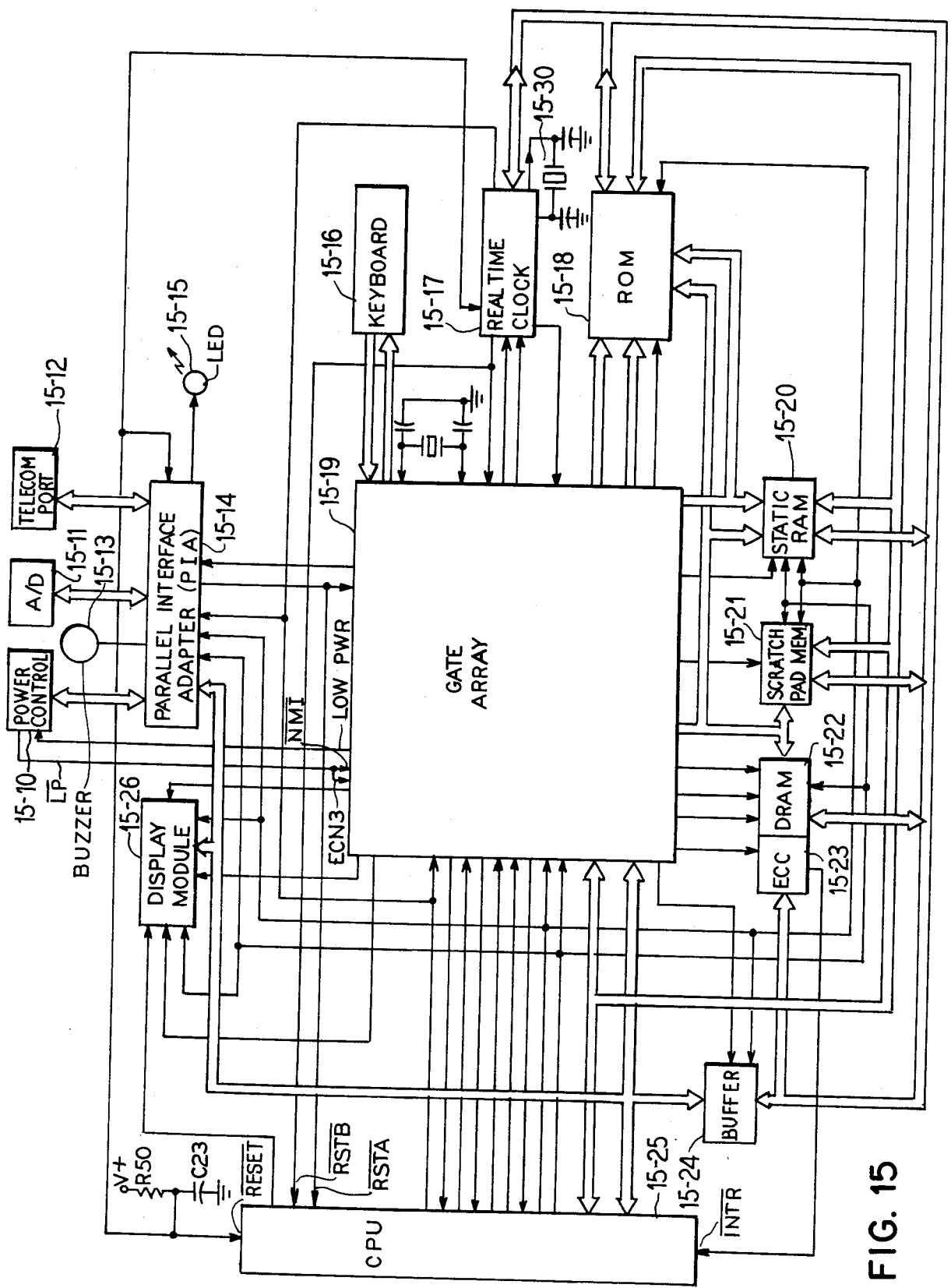
FIG. 15 shows a block diagram for illustrating an exemplary commercial implementation of the present invention.
Figure 16B:
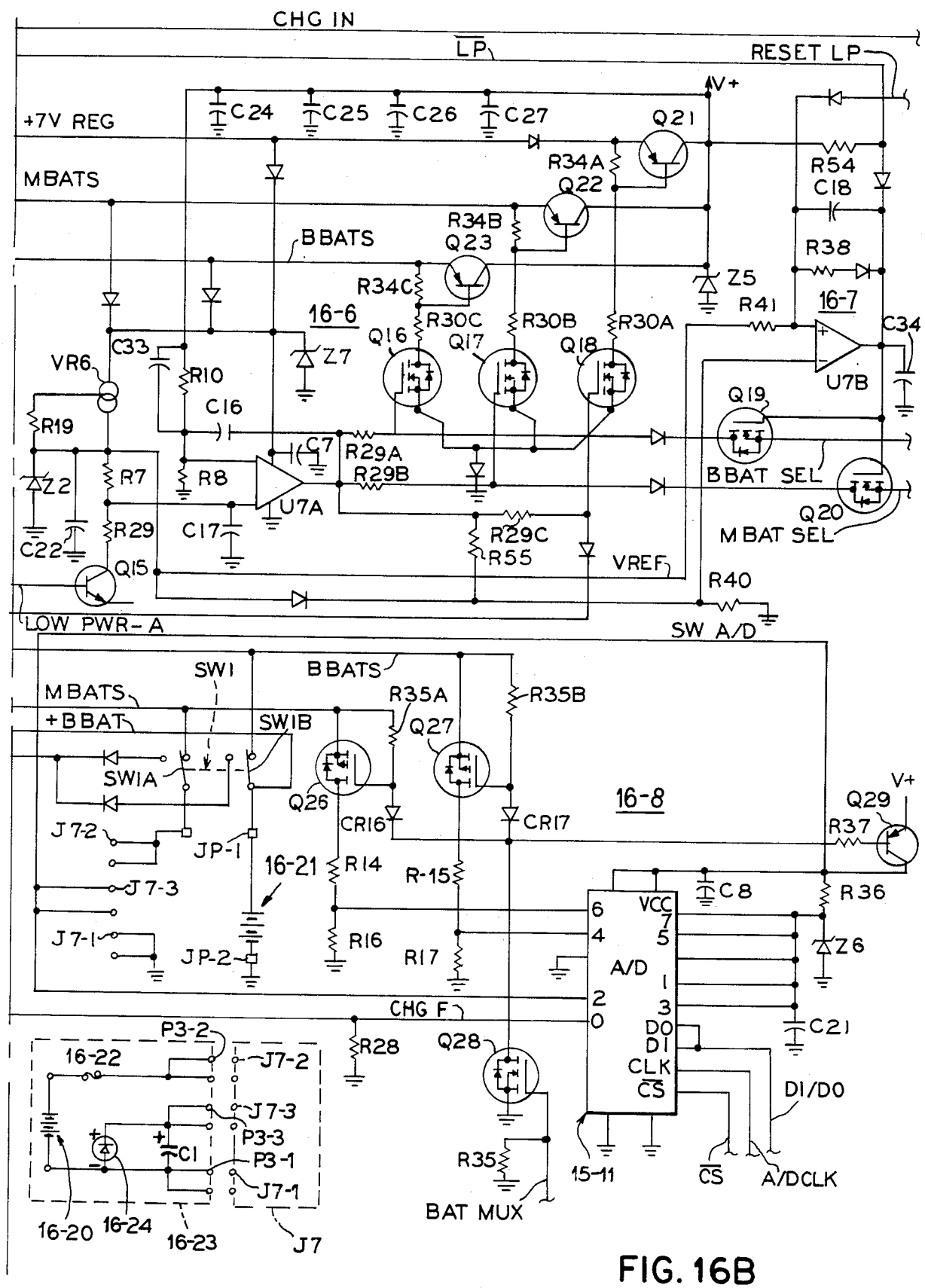
FIG. 16B shows a continuation of the electric circuit diagram of FIG. 16A to the right, and particularly illustrates preferred regulator circuitry, preferred low power detection circuitry, and the preferred association of an integrated circuit analog to digital converter means with a main battery means and a backup battery means, in accordance with a preferred commercial implementation of the present invention.

The general block diagram of FIG. 12, the more specific block diagram of FIG. 5, and the block diagram of FIG. 15 are all considered applicable to a preferred commercial implementation of the present invention whose relevant electric circuitry is shown in greater detail in FIGS. 16A and 16B. (FIG. 5 would have the label for block 20 changed to read RECHARGEABLE MAIN AND BACKUP BATTERY MEANS; and would have labels for blocks 91 and 92 of MAIN BATTERY VOLTAGE MONITOR and BACKUP BATTERY VOLTAGE MONITOR in order to more precisely represent the specific implementation of FIGS. 16A and 16B.) The physical appearance of a portable data system corresponding to the preferred commercial implementation is essentially represented in FIG. 1, while the basic appearance of the main battery pack is essentially as represented in FIG. 4. As best seen in FIG. 16B, a departure from the embodiment of FIGS. 1 through 11 resides in the provision of a main battery means indicated diagramatically at 16-20 and a backup battery means indicated at 16-21, the backup battery means preferably also being a rechargeable battery with the same nominal output voltage. In the illustrated arrangement of FIG. 16B, the main battery is connected via contact SWIA of a manually operated switch SW1 to a conductor MBATS. A fuse 16-22 may be contained within the battery pack housing represented by the dash line 16-23. Further, a temperature sensor component 16-24 for measuring ambient temperature is preferably contained within the housing 16-23 containing the main battery 16-20.

The relevant signals and conductors of the system of FIG. 15 are designated with the same symbols as the corresponding signals and conductors in FIGS. 16A and 16B for convenience in correlating these figures. It will be understood, however, that the specific implementation for component 15-10 shown in FIGS. 16A and 16B is given by way of preferred example only, and not by way of limitation.

Referring to FIG. 15, the power control component 15-10 shown at the upper central part of the figure, may include the specific circuits of FIGS. 16A and 16B, as a preferred exemplary instance. Thus, component 15-10 preferably includes main battery means, standby battery means, a charge voltage input circuit, a main battery charging circuit, a backup battery charging circuit, individual main and backup battery discharge circuits, regulator circuitry including a charging voltage regulating circuit, a main battery voltage regulating circuit and a backup battery regulating circuit, and a low power detection circuit.

A tabulation of the components of FIG. 15 is as follows:
- 15-10: Power Control circuitry (e.g. FIGS. 16A and 16B)
- 15-11: Analog to digital converter (e.g. type ADC0838CCN of National Semiconductor Corp. with differential configuration)
- 15-12: Telecom port for coupling e.g. to a modem and a printer
- 15-13: Buzzer (e.g. driven at 2048 hertz with approximately a twenty percent duty cycle)
- 15-14: Parallel Interface Adapter (e.g. type MC 146823 of Motorola, Inc.)
- 15-15: Red LED signal source (e.g. on keyboard 15-16 to indicate when the unit is plugged into a charger)
- 15-16: Keyboard (e.g. as shown at 11 in FIG. 1)
- 15-17: Real time clock (e.g. type 146818 driven by a 32.768 kHz crystal)
- 15-18: Read only memory (eg. Intel compatible NMOS EPROMS)
- 15-19: Gate array (e.g. type SCX 6224 of National Semiconductor Corp.)
- 15-20: Static random access memory (e.g. CMOS RAM for maximum battery life)
- 15-21: Scratch pad memory (e.g. a CMOS static RAM chip with address decoding in the gate array 15-19 or a dynamic random access memory with address decoding in the gate array 15-19)
- 15-22: Dynamic random access memory (e.g. with either seven bit or eight bit refresh)
- 15-23: Optional error correction circuit (ECC)
- 15-24: Optional CMOS RAM data bus buffer (e.g. a 74HCT245 bidirectional buffer with TTL compatible inputs for translating from NMOS/TTL levels from the dynamic random access memory 15-22 or from the NMOS electrically programmable read only memory 15-18 to the CMOS levels for the central processing unit 15-25).
- 15-25: Central processing unit (e.g. type NSC 800N high-performance low-power microprocessor of National Semiconductor Corp.)
- 15-26: Display module (e.g. a two line, 32-character alphanumeric LCD display, with a 64 character set and eight programmable characters)

DESCRIPTION OF A SPECIFIC COMMERCIAL IMPLEMENTATION OF FIG. 15

Figure 2:
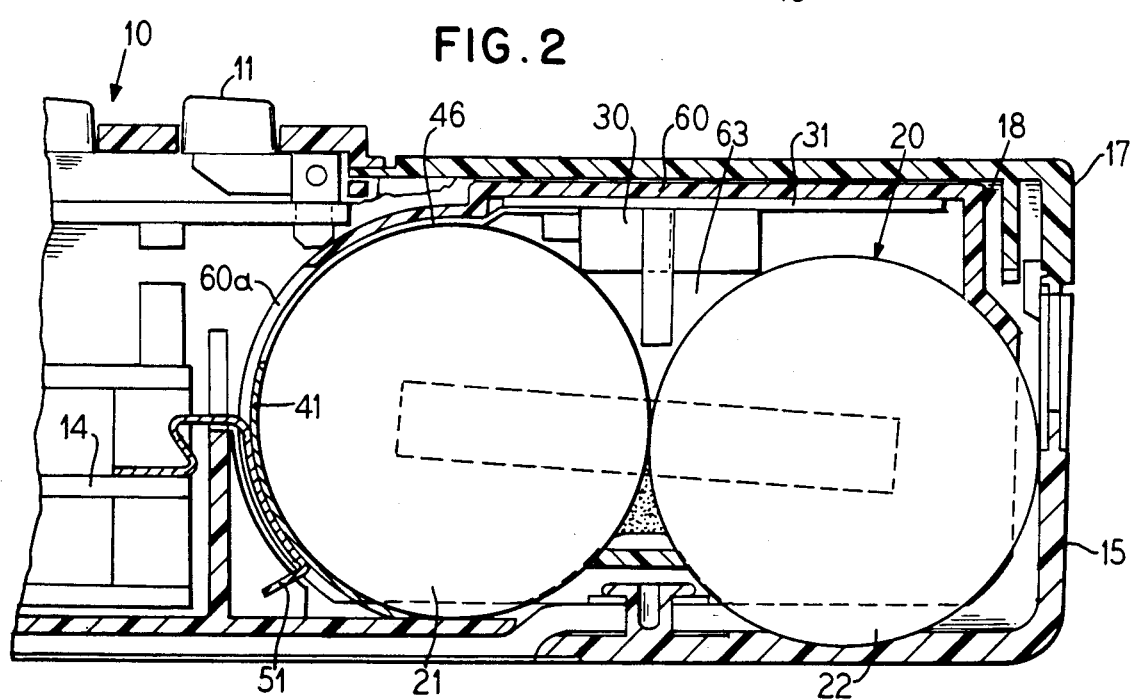
FIG. 2 is a somewhat diagrammatic enlarged longitudinal sectional view showing the battery compartment section and adjacent portions of the portable device of FIG. 1, with a battery pack assembly disposed in the battery compartment in operative coupling relationship with a central processing unit of the portable device for purposes of power supply to the central processing unit and for purposes of transmission of data and command signals.

An exemplary commercial embodiment in accordance with FIG. 15 is made up of four boards, a ROM board, a CPU board, a RAM board and a battery board, and also the LCD display module 15-26 and the keyboard module 15-16. The ROM, CPU, and RAM boards mate together via an eighty pin stake header system. The display module 15-26 is mounted on the CPU board and connects to the CPU 15-25 through a twenty-one pin ribbon cable. The keyboard 15-16 plugs into the ROM board via a seventeen pin stake header. The battery board connects to the CPU board via a six conductor pressure contact system such as indicated in FIG. 2 and FIG. 5 at 41, 51.

The CPU board contains all logic decoding for every device in the unit except for one three-to-eight decoder which is on the CMOS RAM board, and also contains power control circuitry such as shown in FIGS. 16A and 16B, interface circuitry for the communication port (component 15-12, FIG. 15) and components performing various other functions.

The central processing unit 15-25 in a specific implementation of FIG. 15 is of a type which combines the features of the Intel 8085 and the Zilog Z80 in P2CMOS technology. The CPU has direct addressing for 64K bytes of memory, 250 input/output devices, and five prioritized interrupts. The definition of the interrupts is given below.

NMI—DEBUG MONITOR
RSTA—PARALLEL INTERFACE ADAPTER
RSTB—REAL TIME CLOCK INTERRUPT
RSTC—KEYBOARD INTERRUPT
INTR—MEMORY ERROR

Upon power up, the NSC800 CPU is reset for approximately 150 miliseconds and then begins execution from ROM component 15-18 at address 000H. The processor frequency is programmable. The CPU clock can be stopped in a CMOS version to conserve power. Further detail concerning the NSC800 can be found in National Semiconductor's "NSC800 Microprocessor Handbook".

The gate array component 15-19 is designed to minimize the number of integrated circuits in the unit and to maximize its flexibility. The gate array is a type 6224 chip which contains memory mapping registers that expand the total address capabilities of the NSC800. Other major features include a self-scanning keyboard circuit, logic decoding for all devices in the unit, and processor frequency control circuitry.

The parallel interface adapter chip on the CPU board contains three eight-bit programmable input/output ports A, B and C. Port A controls the battery charge/discharge functions, battery select functions, and power control for the analog to digital converter 15-11. Port B contains three bits for communication to the A/D converter 15-11, a buzzer port and four bits for telecommunications (via component 15-12). Port C has one bit for controlling LED light source 15-15 on the keyboard 15-16 to indicate that the charger is plugged in, and seven bits used for telecommunications (via component 15-12). The top four bits of Port C can also be programmed as interrupts which are brought into the NSC800 at the RSTA input. Reference may be made to Motorola's 146823 PIA specification for more details.

All digital integrated circuits are regulated at 4.65 volts for normal operation. The regulation circuit of component 15-10 is designed to run independently either from a charger, from a main battery, or from a backup battery. This is accomplished through PA0 and PA3 on the PIA chip 15-14. In the event that the regulated voltage falls below 4.65 volts, the signal $\overline{LP}$ (complement) from component 15-10 goes low and brings both the main and backup batteries on line. This signal ($\overline{LP}$) will also "wake up" the system through gate array 15-19 if it was previously in a low power mode. The processor component 15-25 can read the state of the line $\overline{LP}$ from a port of the gate array 15-19.

In the CMOS version, the 4.65 volt regulation circuit can be switched to regulate at 2.5 volts via the line LOW PWR which originates at the gate array 15-19 and shifts the reference voltage of the regulation circuit of component 15-10.

Component 15-11 comprises a serial, differentially configured analog to digital converter. The parameters measured are main battery voltage, backup battery voltage, charger voltage, and main battery temperature. This information is used by the processor 15-25 to control battery charge/discharge cycles and to alert the end user of low battery conditions.

The differential mode of component 15-11 effectively increases the resolution to nine bits (512 steps) from eight bits (256 steps) over a given range of measurement. However, in the differential mode, two channels are required per parameter to be measured as opposed to one channel in a single-ended mode. Each of the parameters and its associated channels are given below.

| PARAMETER | CHANNELS |
|---|---|
| CHARGE VOLTAGE | 0,1 |
| TEMPERATURE | 2,3 |
| BACKUP BATTERIES | 4,5 |
| MAIN BATTERIES | 6,7 |

One channel associated with each parameter is tied directly to the 2.5 volt reference (VR). These channels are 1, 3, 5 and 7. With this setup, the voltage span on channels 0, 2, 4 and 6 is two times VR (5.00 volts), or the supply voltage of the A/D converter 15-11, whichever is at a lower voltage. Since the supply to the A/D converter is regulated to 4.65 volts, it becomes the upper limit for all channels.

The A/D converter 15-11 is read serially on Port B of the PIA chip 15-14, and is powered up or down by a bit on Port A. When the A/D converter is powered down (PA6=0), the control lines to the A/D converter on Port B should be at logic zero (0).

A reading of the A/D converter commences by bringing a pin (PB0) of the PIA to a low state, and then supplying from a further pin (PB1) of the PIA a clock signal for clocking into the A/D converter the proper channel and mode (differential) (via PIA pin PB2). The clock signal to the A/D converter must have a 40/60 duty cycle minimum. Next, the A/D converter is reprogrammed to supply a channel reading to the PIA (at pin PB2).

If a 00H is read from a channel of the A/D converter, (such as channel 0) then the other channel of that pair must be read (channel 1 in this case). If both channels read zero, then the parameter is at the midpoint of its range.

In the ROM board, each ROM socket has associated jumpers to allow the use of 8K bytes, 16K bytes, 32K bytes, and 64K bytes Intel compatible NMOS EPROMs. Each ROM socket can also handle a SEEQ compatible 8K byte EPROM. In this mode, the particular ROM socket is set up as a 8K byte EPROM.

Each ROM in the commercial unit can be powered up or powered down under software control to conserve power. The ROMs must be NMOS type or be able to withstand being over-driven on all of the pins in the power down mode. Each ROM receives its power through a saturated switch which is controlled through the MMU registers in the gate array 15-19.

The real time clock 15-17 provides time-of-day functions for the commercial unit and also a 8192 Hz square wave for driving circuitry in the gate array 15-19 on the CPU board. A programmable interrupt is available from the real time clock to the RSTB input of the CPU 15-25. The real time clock chip 15-17 is driven by a crystal 15-30 and may be adjusted by means of a variable capacitor.

The buzzer circuit 15-13 on the ROM board is controlled by software through PB7 on the PIA chip 15-14 of the CPU board. Software should drive the buzzer 15-13 at 2048 Hz with approximately a twenty percent duty cycle (PB7=1). The buzzer signal is inverted by a PNP transistor that drives the charge jack (J6, FIG. 16A) to allow an external buzzer to be connected to the commercial unit.

An optional LED component 15-15 can be added to the keyboard 15-16. The transistor and current limiting resistors are added to the ROM board for controlling this LED. The transistor is turned on by making PC0=1 of the PIA chip 15-14 on the CPU board.

A 17 pin socket is provided on the ROM board for keyboard attachment. A backlight control signal is brought up to this socket in case an electroluminescent panel is used on the keyboard 15-16. The signals on this connector originate from the gate array 15-19 on the CPU board.

The DRAM board has two banks of RAM that accept 64K by one bit or 256K by one bit chips with either 7-bit or 8-bit refresh. Loading is customer dependent.

For maximum data integrity, an optional error correction circuit 15-23 can be loaded onto the RAM board. If the error correction circuit is loaded, then each bank of RAM of component 15-22 must also be loaded with four extra DRAMs to store the parity code. The circuit 15-23 will detect and correct all single bit errors and also alert the CPU component 15-25, in this case on the INTR interrupt.

The bidirectional buffer 15-24 is provided with TTL compatible inputs on the RAM board and is used to translate the data bus from NMOS/TTL levels from the DRAM component 15-22, and from the NMOS ROM component 15-18 of the ROM board to CMOS levels from the CPU component 15-25 on the CPU board. Also, the buffer 15-24 unloads the data bus from the CPU component 15-25, which minimizes propagation delays to the gate array 15-19.

A 2K byte or 8K byte CMOS RAM chip forms component 15-21 and is loaded on the DRAM board to provide "scratch pad area" for the system software. Jumpers are included to switch between the 2K or 8K device. If an 8K byte device is loaded, 4K bytes of this are available. The address decoding for this chip 15-21 is done in the gate array 15-19.

An option in the commercial unit is a completely static CMOS RAM board as component 15-20. This provides maximum battery life for the customer. There are eight positions for 8K byte CMOS RAM chips for a total of 64K bytes maximum. Loading is customer dependent. Decoding is provided by a three to eight demultiplexer.

The same data bus buffer of component 15-24 is loaded on the CMOS RAM board and serves as a translator from NMOS EPROMs to CMOS levels for the CPU component 15-25.

The CMOS RAM board has the same option for scratch pad RAM as the DRAM board previously discussed.

The main battery pack (16-25, FIG. 16B) has a printed circuit board inside with a six conductor flex cable for mating to the CPU board. Also on this board is a LM35 temperature sensor 16-24 for monitoring battery temperature during charge cycles. A one microfarad capacitor (C1, FIG. 16B) is across the LM35 component 16-24 to filter out noise. The LM35 is read by the A/D converter 15-11 on the CPU board.

A custom LCD module for component 15-26 is available from Seiko and plugs into the CPU board. This module is temperature compensated for minus twenty degrees centigrade to sixty degrees centigrade operation. The module provides two by sixteen dot matrix display with self-scanning features. Also in the module are four annunciators that are controlled by a LCD driver chip on the CPU board.

The commercial unit is set up to handle a forty key keyboard configured as a five by eight matrix. At the present time, a 39 key and a 20 key option are available for keyboard component 15-16. A LED 15-15 may be loaded onto the keyboard to indicate various functions.

DETAILED DESCRIPTION OF FIGS. 16A AND 16B

At the charge input (J6, FIG. 16A) on the CPU board, a circuit comprising components Q2, Z4 and VR1 prevents the voltage at the charge input from reaching the direct current to direct current converter circuit 16-1 unless the charge input voltage exceeds 7.5 volts. This charge input cutout circuit provides the following functions.

(a) The buzzer circuit on the ROM board can drive the charge line J1-11 from a two kilohertz, zero to five volts swing and thus allow double duty of the charge jack J6.

(b) The circuit limits the in-rush current to less than two amperes so as not to blow the one ampere fuse F1 at the charge input.

(c) The charge input circuit insures that the charge/discharge circuits 16-2, 16-3 and 16-4, 16-5 do not power up until the charge voltage exceeds the maximum battery voltages.

The input cutout circuit is comprised of pass transistor Q2, 6.2 volt Zener diode Z4, and regulator VR1. When charge input voltage reaches approximately 7.5 volts, Z4 conducts and turns on Q2, which saturates. The voltage regulator VR1 limits the current through Z4 and thus limits the gain of Q2.

The charger input voltage on the CPU board is regulated down to 7.2 volts by a switching direct current to direct current converter 16-1. This converter provides up to 750 milliamperes with a wide input voltage range of ten volts to twenty volts.

The regulated 7.2 volts of the DC/DC converter 16-1 feeds the linear V+ regulation circuit 16-6 (FIG. 16B) and the battery charge/discharge circuits. When the unit is turned off, (at switch SW1, FIG. 16B) pin 6 of the component RC 4192 NB in the circuit 16-1 is pulled low to keep the converter 16-1 powered down.

Incorporated onto the CPU board is circuitry to charge or discharge the main and backup batteries independently. These circuits maximize the life of the batteries and give the end user a means by which to measure the capacity of each battery set. The battery charge functions are controlled through port A of the PIA chip 15-14.

The main battery set indicated at 16-20 in FIG. 16B (at the lower left), which is rated at 2.2 amperes, is set up to charge at a 275 milliampere rate (C/8). This is accomplished by making PA4=0 and PA5=0 on the PIA chip 15-14. When the main batteries are charging, operational amplifier U6 (shown at the lower part of FIG. 16A at the left) is set up as a constant current source by forcing the collector of Q8 to 0.275 volt above the battery voltage. The floating voltage reference Z1 senses Q8 collector voltage and then effectively subtracts 0.275 volts across R33 which is then fed back to the inverting input of op-amp U6. The noninverting input of U6 closes the loop by sensing the main battery voltage. Constant current source VR5 limits the battery drain through Z1 which is especially important in the CMOS version of the commercial unit.

The main batteries can be made to discharge at a constant C/8 rate by making PA5=1 and PA4=1 of the PIA chip 15-14. This turns on Q10 and allows VR2 to act as a constant current sink.

The backup batteries indicated at 16-21 at the lower left part of FIG. 16B (rated at 225 milliampere hours) can be made to charge under software control at a C/8 rate by making PA1=1 and PA2=0 on the PIA chip 15-14. This saturates Q12, and VR3 acts as a constant current source to the backup batteries 16-21, FIG. 16B.

The backup batteries 16-21 can discharge at a constant current of C/8 by making PA2=1 and PA1=0 at the PIA component 15-14. This saturates Q14, allowing VR4 to act as a constant current sink.

Both the main and backup batteries will trickle charge at a C/100 rate if they are not in a charge or discharge cycle and the 7.2 volt DC/DC converter 16-1 is within regulation. This is accomplished by switching different resistors into the current sources that feed the main and backup batteries, which is done automatically with the particular set of batteries is taken off a C/8 charge.

All the digital integrated circuits of the system of FIG. 15 are regulated at 4.65 volts for normal operation. This is accomplished by operational amplifier U7A, FIG. 16B, pass transistors Q21, Q22 and Q23, and voltage reference Z2 (shown at the central left of FIG. 16B). The regulation circuit 16-6 is designed to run independently off either the charger input voltage at J6 (at the upper left of FIG. 16A), main battery voltage, or backup battery voltage. This is accomplished through PA0 and PA3 of the PIA chip 15-14. In the event that the regulated voltage falls below 4.65 volts, the output of comparator U7B (at the middle right part of FIG. 16B) goes low and brings both the main and backup batteries on line. The output of comparator U7B will also "wake up" the system via the line $\overline{LP}$ through the gate array 15-19 if the system was previously in a low power mode. Software can also read the state of this signal through port 2 of the gate array 15-19. In the CMOS version of the commercial unit, the 4.65 volt regulation circuit 16-6 can be switched to regulate at 2.5 volts by bringing the LOW PWR signal high, which turns on Q15 (shown at the center left of FIG. 16B) and thus shifts the reference voltage of the regulation circuit. The conductor LOW PWR (which produces the signal LOW PWR-A at Q15) is controlled through the gate array 15-19.

As explained with reference to FIG. 15, the commercial unit has incorporated a serial, differentially configured analog to digital converter and this converter is shown at 15-11 in the lower right corner of FIG. 16B. The parameters measured are main battery voltage, backup battery voltage, charger voltage, and main battery temperature. This information is used by software to control battery charge/discharge cycles and to alert the end user of low battery conditions.

As previously explained, one channel for each parameter is tied directly to the 2.5 volt voltage reference which is shown at Z6 at the lower right of FIG. 16B. With this setup, the voltage span on channels 0, 2, 4, and 6 of converter 15-11 is twice the voltage across Z6 or 5.00 volts, or else the supply voltage of the converter (at VCC), whichever is at a lower voltage. Since the supply to the converter 15-11 is regulated to 4.65 volts, this value becomes the upper limit for all channels.

Converter 15-11 is controlled from the PIA chip 15-14 as previously explained. This $\overline{CS}$ line connects with PB0 of the PIA, while A/D CLK connects to PB1 and DI/DO connects with PB2.

In order to read voltages greater than the regulated supply (VCC) of the converter 15-11, voltage dividers are used to scale down the battery channels and charge voltage channels.

As previously mentioned, the main battery 16-20 and temperature sensor 16-24 are not on the CPU board, certain of the six connector means being designated P3-1, P3-2 and P3-3, these connector means connecting with locations J7-1, J7-2 and J7-3 of the CPU board as indicated diagrammatically at J7 at the lower left of FIG. 16B. The backup battery 16-21 may be readily removable and replaceable from the CPU board in a conventional manner as indicated at JP-1 and JP-2 in FIG. 16B. The temperature sensor may be a LM335AZ and may have a suitable capacitance value connected thereacross as indicated at C1 to filter out noise.

GENERAL DISCUSSION OF THE EMBODIMENT OF FIGS. 15, 16A AND 16B

The present embodiment of FIGS. 15, 16A and 16B, departs from the initial embodiment of FIGS. 1 through 11 in that all of the circuitry is removed from internal to the battery pack with the exception of the temperature sensing element 16-24. This allows for a considerable decrease in cost of the expendable battery pack 16-23.

Furthermore, in comparison to the embodiment of FIGS. 1 through 11, the present embodiment replaces the several comparators and many precision costly components that were in the battery pack with the analog to digital converter 15-11 on the CPU board.

In the illustrated embodiment, complete isolation is provided of the main and backup batteries for reliable back-up run time and operational life.

A special lower power sensing technique is provided utilizing the operational amplifiers U7A and U7B, FIG. 16B.

The battery charging and power handling algorithms such as represented in FIG. 14 may be embodied in firmware to achieve optimum flexibility, operational run time and battery life. These algorithms have been explained in relation to FIGS. 12-14, and will be further explained in the following.

Unit operation is derived from any one or all three available power sources.

The all electronic isolation and power switching is accomplished through a very low power regulator circuit 16-6. Electronic isolation and switching control provides the unit with the features of reliable back battery run time, and precise charging and discharging control of the main and backup batteries. The same power control circuit is quite flexible and can be used with nickel cadmium, zinc-carbon, lead acid and alkaline batteries, or with capacitors as a power source. Batteries are controlled by their deselection through two bits on the PIA port. The charge is essentially always selected.

The first power source is the main battery 16-20 consisting of four $\frac{1}{2}$ D 2.2 ampere hour rechargable nickel cadmium cells connected in series. This provides an operating voltage range of from 4.65 to 7.5 volts with five volts nominal.

The second power source is the backup battery 16-21 comprised of four $\frac{1}{3}$ Af 0.225 ampere hour nickel cadmium cells connected in series. This second power source also has an operating voltage range of from 4.65 to 7.5 volts with five volts nominal.

Last, the charge input source will power the unit and recharge its batteries from a wide voltage range, for example, with a portable unit connected at times into a vehicle electrical system. The wide charge input range, and elimination of the need for large costly heat sinks is made possible by a small size, high efficiency DC/DC converter 16-1 incorporated into the portable unit. A range of 9 to 24 volts input is supported. The current is fifty milliamperes for the 24 volt input and is 650 milliamperes at a nine volt input value.

The heart of the regulator circuit 16-6 is a TLC27L2BC micropower dual operational amplifier (U7A, U7B, FIG. 16B). The regulator circuit itself consumes only thirty microamperes of current but can provide the system with 500 milliamperes of current from either battery or charge input (J6, FIG. 16A). The regulator circuit 16-6 can be operated from four to ten volts and is switchable not only from different supplies but also from a set point value of 4.65 volts to a low power mode set point of 2.5 volts. The regulator has a very low dropout voltage (even for high currents) of only fifty millivolts over the regulated output voltage range. This combined with the low 4.65 volt regulation voltage allows the most power possible to be efficiently removed from a set of four nickel cadmium batteries which have an end-of-discharge voltage of 4.7 volts for GE batteries at the terminal load levels.

There are two major regulation modes of system operation that can be selected under firmware control with several minor modes within them. Normal operation with dynamic RAM as shown at 15-22, FIG. 15, is with the system under power at 4.65 volts. The microprocessor clock is running at various speeds providing refresh to the memory array 15-22. The clock can also be stopped at the 4.65 volts type of regulation mode to use self refreshing dynamic RAM. The other mode of operation is the low power, power down mode which operates with a standby voltage of 2.5 volts. It is used only with CMOS static RAM, as represented by component 15-20, FIG. 15.

LOW POWER DETECTION

One of the most unique functions is the method in which low power is detected. The same circuit 16-6 detects low power from either battery power or for the case of power supplied by a charging source connected at J6, FIG. 16A. This lower power condition is sensed by measuring the regulator output voltage of the operational amplifier U7A which is common to all driver sources/switches of FIG. 16B. Under normal operation this voltage is between 0.3 volt and 0.8 volt where the field effect transistors Q16, Q17 and Q18 are implemented as type TNO106N3 N-channel MOS field effect transistors with low gate threshold voltage. When a low power condition is sensed by U7A, its output voltage will rise to a maximum value; for example when the power source that the unit has selected is removed or goes low such as occurs when the unit is taken off its charger, or a battery is goes dead with its voltage dropping off. When the output of U7A rises to or above 2.7 volts, the circuit produces a low power logical output signal via U7B of low power detector 16-7. The 2.7 volts produced at the output of U7A is far outside the range of normal operation and provides a simple reliable solution for detecting low battery within the regulator circuit 16-6. This otherwise is a complex problem requiring a low battery voltage sensing circuit with many precision components to make the threshold for sensing the low voltage condition close to the regulation voltage, for optimum utilization of the battery. Such a circuit utilizing many precision components may be plagued by a susceptibility to circuit noise problems causing false triggering of the low voltage detection circuit.

LOW POWER SELECT

When operating in the 4.65 volt mode, if a low power condition is detected by regulating circuit 16-6, the output of the detection op-amp U7B will be low. This low signal on Q19 and Q20 will turn them off, in turn switching on both main and backup batteries. At this time all sources are hardware selected regardless of software selections at the PIA ports.

The low power signal is available to the main processor 15-25 through the gate array input port ECN3 which is connected to the signal line $\overline{LP}$ from the power control 15-10. The processor would then interrogate the power sources through A/D converter 15-11, determine what had occurred and make the new selection. In the low power mode, the operation is the same but the processor clock may be stopped. Because of this, the gate array 15-19 (in the particular embodiment illustrated) performs a wake up function started by the low power signal which appears at port $\overline{NMI}$ of the gate array.

CHARGE AND DISCHARGE CIRCUITRY

The unit includes a set of constant current charge and discharge circuits for each battery to provide precise charging, capacity measurement, and battery conditioning functions.

The main battery charge circuit features a special very low dropout (0.5 volt) constant current regulator circuit 16-2 that derives its sensing feedback from the positive side of the main battery 16-20. This low dropout current regulator operating from the DC/DC seven volt REG input gives high efficiency charging, eliminating the need again for large heat sink means in a portable unit. Other low drop out constant current battery charging circuits put the sense resistor in the negative ground leg which floats the battery off ground by the IR voltage drop across the resistor. This voltage drop lowers the effective useful battery voltage. It can be made a small value but then would require precision components to sense the low voltage condition especially at low charging currents. For this reason this technique is prone to noise problems or low precision. The charge rate is software selectable between the C/8 and the C/100 rate.

Backup battery constant current charging is also software selectable between C/8 and C/100 rates. This charging circuit 16-3 senses the current in the positive lead of the backup battery 16-21 for feedback. This feature is accomplished with only six low-cost small-size components.

Both the main and backup batteries have connected to them the same design of constant current discharge circuitry. Each uses a simple three terminal regulator (i.e. regulators 16-4 and 16-5) for controlling the battery discharge cycle. This function is software selectable for doing timed discharges for measuring battery capacity and is also used for deep discharging for conditioning each of the batteries.

ANALOG TO DIGITAL CONVERTER

The unit uses a nine bit resolution converter 15-1 as previously described, connected to the PIA component 15-14. As previously explained, four parameters can be read by the processor 15-25 and the information used to set the operating mode and battery handling algorithm. The precise temperature of the main battery can be measured. Its value is also used to determine the control of the backup battery and system run speed. Charging voltage is measured to detect when a reliable voltage range can be used by the unit for charging of the batteries. Main and backup battery voltage can be accurately measured to +/- twenty millivolts through the A/D converter 15-11. The measured voltages are used for the battery control algorithms to be explained further with reference to FIG. 17 of the drawings.

OPERATIONAL DESCRIPTION OF THE SYSTEM OF FIGS. 15, 16A and 16B

To provide the user with the longest run time while maintaining functionality, the unit incorporates a sophisticated energy management system. A basic purpose is to reduce the operational power consumption of the unit without hindering the unit's normal intended operation. For the most part the energy mamagement operation is transparent to the user. The operational run time is quite dependent on actual implementation of this function. For DRAM units this is a factor of three, and for CMOS it could be as high as one thousand.

Power conservation in the unit is handled by operating it in the most power efficient manner to accomplish the task. For the most part, run speed is reduced, or functions are turned off when not in use. A special case of this is with the CMOS unit in the sleep mode where the clock is stopped.

For DRAM or CMOS units the object is to maximize the amount of run time at the slowest allowable standby speed which is reduced by a factor of 1/32 for DRAM and by a factor of 1/128 for CMOS. When a task is to be performed it should be done as quickly as possible at 1/1 speed, an the unit then returned to standby speed. If the task requires the unit to be operating at a faster than normal standby speed while waiting for an occurrence then this speed should be as low as practical for the application.

A very important power conserving mode that is only used for CMOS versions is power down sleep mode. In this mode the CPU clock is stopped with data memory retained. The keyboard 15-16 is active as is the real time clock 15-17. To indicate that the unit is still turned on and in this mode, the shift annunciator of display 15-26 is left on. To wake up the system from this mode and restore normal operation, the user need only to press any key of keyboard 15-16.

The full speed and especially the waiting time from standby to power down must be as short as possible because it can so affect battery run time. This can make the difference between an operational time of the unit of a few hours, and an operational time of over a year. This waiting time requirement is both application and user dependent. A programmable waiting time with a default value of ⅓ of a minute can meet all application and system requirements. Through a shifted key function, the waiting time could be adjusted in seconds on a temporary twenty minute basis by the user; this being the manner in which the back light function is now handled. The default value should also be programmable according to the application.

FUNCTIONS AND FEATURES

All functions and features are implemented from calculations based on five key measured or determined parameters which are as follows:

(1) System Configuration

Upon power up, the type of RAM and size are determined and saved for use with internal loading calculations. External devices which are operated from the unit's battery are accounted for on an as-used basis.

(2) Real Time Clock (15-17, FIG. 15)

The clock is used with internal loading, charging and capacity testing functions.

(3) Temperature Measurement

Main battery temperature is used to calculate charging rates and times, and also controls the setting for the minimum standby run speed for lowest power consumption.

(4) Charge Voltage

The charging voltage at input J6, FIG. 16A, is measured to detect the charging mode and to insure that the charging voltage is in a usable range for battery charging or unit operation.

(5) Battery Voltage

Both main and backup battery voltages are available for use in CPU calculations to determine system status and operation.

Fuel Gauge—As part of normal operation the unit keeps track of remaining capacity. This information can be made available to the user in the form of a run time fuel gauge display on module 15-26. This display is made available to the user through a shifted key function.

Run Time Remaining—This can be calculated from remaining capacity and battery voltage, providing remaining run time until low battery is expected. Ths could be handled as a shifted key function and run time displayed in hours and minutes.

Normal Recharge—A complete recharge is accomplished in eleven hours for the main and backup batteries at room temperature. The normal charge rate for both batteries is at the C/8 rate and is controlled by the CPU component 15-25.

Over-Charge Protection—This feature promotes longer battery life by preventing unnecessary over charge in route accounting where the unit is continually plugged in and out from a charger. Where the unit is removed from charge, it keeps track of the power removed from the battery that is selected. When returned to a charger, the CPU will calculate the power to be returned to the battery. It will then set the charge time based on the amount of charge removed and the recharging temperature.

Over-Under Temperature Protection—As a protection from permanent damage or degradation, the unit at high temperature (seventy degrees centigrade) will cut off charging, and will start to taper off the charge rate at low temperatures below ten degrees centigrade down to minus twenty degrees centigrade, at which temperature charging stops.

Variable Recharge Rate—The wide range of recharge rates is under CPU control for optimum charging under all operating conditions.

Standby Holding Charge—This feature keeps the batteries at full charge ready for use by charging them at C/100 rate controlled by the CPU component 15-25.

Charging Indicator—A positive indication that the unit is plugged into a charger and is charging may be provided as indicated at 15-15 in FIG. 15.

Capacity Test/Periodic Maintenance—The capacity of each battery can be measured to precisely indicate its condition so that the user can determine when batteries should be replaced. The required periodic use of this feature virtually eliminates the memory effects and voltage depression. This preventative maintenance does a complete test of both battery power systems to insure reliable operation and guaranteed run time without loss of RAM data. In addition, its use will extend normal battery service life to approximately one year. This is required every two months to guarantee battery life and run time. This is done by normal recharging being first completed, followed by a timed constant current deep discharge at a C/8 rate. With discharge time and rate known, the processor calculates the capacity. The capacity is displayed in minutes of a normal eight hour rated capacity. If this capacity is less than the entered or the default (eighty percent) of rated value, the unit will start a new capacity test and retry until the minimum value is reached, or until the test has been executed three times. The number of retries can be selected by the user, or can be programmed according to the application. Also, the test can be started by the user, or initiated by automatic programming according to the application.

Low Battery Indicator—When the unit is being charged, the low battery indicator signifies when the recharging process has been completed for both batteries. When the unit is off of charge, the low battery indicator advises the user when the batteries are low and need to be recharged to prevent loss of data. Once in low battery, the user is given ten percent of the backup battery capacity in slow speed operation, after which time the keyboard 15-16 is locked out. In low battery condition, the unit will activate any internal or external loads to finish a limited transaction such as printing a ticket or doing a charge coupled device reading operation (e.g. by means of a bar code reader). The unit run time in low battery before and after lockout is dependent on system loading and usage. The time before lockout will be about ten minutes and low battery run time before memory loss will be about one hour with DRAM units. With a CMOS unit, the time periods could be ten times the values just given for DRAM units. If the backup battery is low, with the main battery charged, the system will give the user a system error code telling him not to remove the main battery pack, but to get the unit to a charger and download RAM data. The user can expect one hour of standby time after low battery is reached.

Deep Discharge Indicator—During a discharge cycle, the CPU measures the battery voltage and determines when the batteries have been completely discharged.

Overvoltage Indicator—This tells the CPU when the batteries are not accepting a charge; such condition being detected by the presence of a high charge voltage profile across the battery terminals.

Self Diagnostic Battery Testing—The power system testing is available in all units and can be used to identify defective units in manufacturing before delivery. Also battery condition can be easily checked by field service, and most importantly, by the customer.

Transparent conditioning deep discharge—If a battery has gone into low battery condition, the user can be prompted by means of display 15-26 when the unit is returned to charge if a conditioning deep discharge should be performed on that battery since at this time it will take little extra recharging time to effect such conditioning. The conditioning cycle comprises a deep discharge of the battery followed by a normal recharge thereof.

The following tables D, E1, E2 and E3 will summarize operations of the system during recharging and during portable operation with power from the charging source removed.

TABLE D
RECHARGING

TABLE D-continued $$\text{RECHARGE TIME} = \frac{CC - RC}{CE * DC}$$

CC = FULL CHARGED CAPACITY AT TEMPERATURE
RC = REMAINING CAPACITY IN BATTERY
CE = CHARGE EFFICIENCY
DC = CHARGE DUTY CYCLE

RC MAIN = 2.2 AH — POWER REMOVED
BACK = .175AH — POWER REMOVED

| CC | = 25 C. OR LESS | GREATER THAN 25 C. |
|---|---|---|
| MAIN | 2.2 AH | 2.2 AH −1%/C. FROM 25 C. |
| BACK | .175AH | .175AH −1%/C. FROM 25 C. |

| CE = 10 C. OR LESS | | | GREATER 70 C. |
|---|---|---|---|
| | 10 C.-25 C. | 25 C.-70 C. | |
| MAIN .198AH − 1.94%/C. FROM 10 C. | .198AH | .198AH − 1.6%/C. FROM 25 C. | 0 |
| BACK .01575AH − 1.94%/C. FROM 10 C. | .01575AH | .01575AH − 1.6%/C. FROM 25 C. | 0 |

| DC | = 10 C. OR LESS | 10 C.-70 C. | GREATER 70 C. |
|---|---|---|---|
| MAIN | 3.3% REDUCTION/C. FROM 10 C. | 100% | 0% |
| BACK | 3.3% REDUCTION/C. FROM 10 C. | 100% | 0% |

TABLE E1
POWER REMOVED - BASE INTERNAL LOADING

| CLOCK SPEED | CMOS *(1) | | | | DRAM *(1) | | | | OPERATIONAL MODE |
|---|---|---|---|---|---|---|---|---|---|
| | 32K | 64K | 128K | 256K | 64K | 128K | 256K | 512K | |
| 1/1 | 75 | 91 | 110 | 130 | 147 | 209 | 184 | 252 | DRAM OR CMOS RUN |
| 1/2 | 65 | 80 | 95 | 114 | 121 | 167 | 134 | 188 | " |
| 1/4 | 59 | 75 | 87 | 107 | 106 | 142 | 113 | 153 | " |
| 1/8 | 56 | 72 | 82 | 103 | 98 | 130 | 102 | 135 | " |
| 1/16 | 56 | 71 | 82 | 102 | 94 | 124 | 96 | 126 | " |
| 1/32 | 55 | 70 | 81 | 100 | 92 | 120 | 94 | 121 | DRAM STAND BY *(2) |
| 1/64 | 55 | 70 | 81 | 100 | | | | | CMOS STAND BY |
| 1/128 | 54 | 69 | 79 | 99 | | | | | CMOS STAND BY |
| STOP 5V | 20 | 25 | 30 | 35 | | | | | CMOS POWER DOWN *(3) |
| STOP 2V | 1/4 | 1/4 | 1/4 | 1/4 | | | | | CMOS POWER DOWN *(4) |

*(1) ALL RATES IN MAH/HOUR
*(2) MINIMUM VALUE DEPENDENT ON TEMPERATURE SEE "STAND BY RUN SPEED REQUIREMENTS VS. TEMPERATURE"
*(3) LCD DISPLAY IS ON
*(4) DISPLAY OFF BAR ANNUCIATOR IS ON

- MINIMUM DRAM STAND BY CLOCK SPEED VS. TEMPERATURE

| TEMPERATURE | MINIMUM CLOCK SPEED |
|---|---|
| 39° C. OR LESS | 1/4 MALFUNCTION |
| 40° C.-45° C. | 1/32 |
| 46° C.-55° C. | 1/16 |
| 56° C.-65° C. | 1/8 |
| 66° C.-99° C. | 1/4 |
| 100° C. OR GREATER | 1/4 MALFUNCTION |

TABLE E2
POWER REMOVED (CONTINUED) - INTERNAL LOADING

INTERNAL PIA - THIS MUST BE ENABLED BY THE POWER CONTROL PORT EACH TIME A TRANSMISSION IS TO TAKE PLACE THROUGH THE TERMINALS 15 PIN EIA INTERFACE CONNECTOR. THE INSTALLATION OF THIS HARDWARE IS IDENTIFIED BY INPUT PORT ECN 1 CONNECTED TO LOW.
BACK LIGHT -

| FUNCTION | LOADING PER EVENT (MAH) |
|---|---|
| (1) INTERNAL PIA | 18.0/HOUR |
| (2) BACK LIGHT | 25.0/HOUR |
| (3) BUZZER | 15.0/HOUR (100 MAH TIMES 15%) |

TABLE E2-continued
POWER REMOVED (CONTINUED)
- INTERNAL LOADING

INTERNAL PIA - THIS MUST BE ENABLED BY THE POWER CONTROL PORT EACH TIME A TRANSMISSION IS TO TAKE PLACE THROUGH THE TERMINALS 15 PIN EIA INTERFACE CONNECTOR. THE INSTALLATION OF THIS HARDWARE IS IDENTIFIED BY INPUT PORT ECN 1 CONNECTED TO LOW.

BACK LIGHT -

| FUNCTION | LOADING PER EVENT (MAH) |
|---|---|
| (4) | ./ |

TABLE E3
POWER REMOVED (CONTINUED)
- EXTERNAL LOADING

| | DEVICE | LOADING PER EVENT (MAH) |
|---|---|---|
| (1) | MARS PRINTER | 0.258/LINE |
| (2) | 20/20 | 1.0/READ |
| (3) | ACOUSTIC COUPLER | 60.0/HOUR |
| (4) | CCD | .75/READ |
| (5) | WAND | 100./HOUR |
| (6) | PIA | 18./HOUR |

Fuel Gauge—The value to be displayed is remaining capacity (RE) which is known at all times by the system and shown either in ampere-hours or in percent capacity.

Run Time Remaining—Implementation of this feature during portable operation is based on both calculated remaining capacity and the rate of decrease in battery voltage to determine expected run time. If the rate of decrease in battery voltage is declining, then calculated remaining capacity (RC) is used to determine expected run time. If the rate of decrease in voltage is increasing or constant, then the system uses the calculated (RC) value or the measured rate to estimate the time from present battery voltage down to 4.7 volts, whichever is less.

The following tables F1 and F2 summarize the procedure in calculating run time.

TABLE F1
CALCULATING RUN TIME
FROM REMAINING CAPACITY (RE)
REMAINING RUN TIME =

$$\frac{\text{REMAINING CAPACITY (RE)}}{\text{PRESENT AVERAGE LOADING RATE}}$$

(The estimated run time is calculated from remaining capacity and the loading rate. The loading rate is available but is constantly changing and must be averaged for this calculation. This averaging time period should be kept in the range from one to ten minutes.)

TABLE F2
CALCULATING RUN TIME
FROM RATE OF BATTERY VOLTAGE DECREASE
REMAINING RUN TIME =

$$\frac{\text{PRESENT VOLTAGE} - 4.7 \text{ VOLTS}}{\substack{\text{PRESENT AVERAGE RATE} \\ \text{OF VOLTAGE DECREASE}}}$$

(The run time is calculated from measured values of battery voltage and the rate of voltage decrease. The rate of decrease is constantly changing and must be averaged with a time period in the range from one to ten minutes.)

DESCRIPTION OF FIG. 17

FIG. 17 illustrates the aspects of the overall system of a commercial implementation of FIG. 15 which pertain to the operation of the power control circuitry of FIGS. 16A and 16B.

Block 17-1 shows the commercial unit operating under battery power at the normal regulator output voltage (V+, FIG. 16B) of 4.65 volts.

Referring to processing operation 17-2, the CPU component 15-25 may be programmed to provide a waiting interval for example of one minute between successive executions of step 17-3.

Step 17-3 will be understood from the previous description of the signal line LP which is controlled by the output of operational amplifier U7B, FIG. 16B, of the power regulator circuit 16-6, and from the explanations concerning the analog to digital converter 15-11, FIGS. 15 and 16B. The status of signal LP depends on whether the regulator circuitry 16-6 is able to maintain a desired (setpoint) output voltage or whether this is not the case because of a low power condition of the input power source.

The processing sequence represented by step 17-4 is exemplified by the pseudo code listing found in Appendix A which follows this section.

According to decision block 17-5, the processing loops back to block 17-1 until processing operations requiring the CPU component 15-25 are complete. When the CPU is no longer required, control passes to step 17-6 to execute a "power down" operation.

In the "power down" procedure of step 17-6, the output LOW PWR from component 15-19 establishes operation of the power regulator circuit 16-6 with a setpoint voltage of 2.5 volts. A 4.19 megahertz crystal 15-31, FIG. 15, stops generating its signal, and the CPU component 15-25 also stops, to conserve battery power.

As represented by block 17-7 in FIG. 17, while the system is in power down mode, a check is made periodically to determine if any event occurs which requires CPU operation. So far as relevant to FIGS. 16A and 16B, step 17-7 involves monitoring the line $\overline{\text{LP}}$ from the low power detection circuit 16-7, FIG. 16B. If a low power battery condition develops (with respect to the supply voltage setpoint of 2.5 volts), this will be sensed by automatic regulator circuit 16-6 which in turn will cause switching of operational amplifer U7B to produce a low signal at line $\overline{\text{LP}}$. Referring to block 17-7, the presence of the low signal corresponds to the condition $\overline{\text{LP}}$ equals logical zero and $\overline{\text{NMI}}$ equals logical zero so that control passes to block 17-8.

In block 17-8, the LOW PWR line shown at the center left of FIG. 16A is switched, turning off Q15 and switching the power regular to supply the normal output voltage of 4.65 volts. Since the power regulator 16-6 at the normal setpoint will be expected to again produce the $\overline{\text{LP}}$ signal, the CPU component 15-25 will determine the presence of the condition in due course and alert the user as previously described.

Block 17-7 may also represent a response to other conditions such as user actuation of a key of the keyboard 15-16, but such procedures have not been detailed in FIG. 17 since they are not relevant to the signals supplied to and from the power control circuitry 15-10 (as will be understood from the overall system illustration shown in FIG. 15).

It will be apparent that the power down of CPU component 15-25 may be omitted, in which case the CPU may respond to its own clock and check the condition of line $\overline{LP}$ at suitable intervals during a low power mode that only affects other components. In this case the lines $\overline{LP}$ and LOW PWR would extend directly from power control 15-10 to suitable input and output ports of the CPU component 15-25, so that operation of the power control circuitry would be entirely independent of gate array 15-19.

APPENDIX A (Notes on Programming for FIGS. 15, 16A, 16B and 17)

The present section comprises an edited copy of notes on the system programming for the commercial unit of FIGS. 15, 16A, 16B and 17. In this section "121" refers to a model 121 commercial unit generally as shown in FIGS. 12, 13 and 14 herein, while "121XL/141" refers to models according to FIGS. 14, 16A, 16B and 17. The programming monitors for these latter models are designated IPMQNAZ and IMQNAP. (The programming monitor for the model 121 of FIGS. 12–14 is designated IPMONAP.)

APPENDIX A

NOTES FOR VERSION 1.1 OF IPMQNAZ AND IPMQNAP

BATTERY MAINTENANCE

The PSUEDO code below is representative of the system capsule code executed every five seconds during idle periods. This code determines the condition of the batteries and charger. It reports the condition with the beeper, LCD low batt and recharging 'flags'.

There are three timers being incremented or decremented by a clock interrupt routine to support this routine. The interrupt routine is also responsible for determining the charger duty cycle. (Note: the clock interrupt routine calls the routine described here to update the battery status no less than once a minute.) The charger duty cycle is reduced by 3.3% for every degree centigrade below 10C, and reduced to 0% when the battery temperature > 70C.

Lock up timer: Counts down once every minute until zero is reached.
Main battery timer: Counts down for the number of seconds on charge until zero is reached.
Counts up for every second of battery drain until eleven hours is reached.
Backup battery timer: Counts down for the number of seconds on charge until zero is reached.
Counts up for every second of battery drain until eleven hours is reached.

BEGIN PSUEDO CODE FOR BATTERY MAINTENANCE

```
REPEAT
  LOW BATT FLAG (IN DISPLAY) = OFF
  DESELECT BOTH BATTERIES
  IF NEITHER SELECTED CAUSES LOW POWER INTERRUPT THEN (NO CHARGER)
    RECHARGING FLAG = OFF
    SELECT MAIN BATTERY
    DISCHARGE BOTH BATTERIES = OFF
  ELSEIF CHARGER < 20V THEN (GOOD CHARGER)
    RECHARGING FLAG = ON
    FOR EACH BATTERY DO
      IF BATTERY TIME <> 0 THEN (NOT FULLY CHARGED)
        LOW BATT FLAG = ON
        IF TEMPERATURE BASED DUTY CYCLE ALLOWS CHARGER TO BE ON AND
          NOT BATTERY DISCHARGE AND
          BATTERY < 6.2 VOLTS THEN
            BATTERY CHARGE = ON
        ENDIF
      ENDIF
    ENDFOR
  ENDIF
```

```
FOR EACH BATTERY DO
   IF TEMP < -20 DEG C OR
      TEMP > 70 DEG C OR
      (BATTERY < 3.7 VOLTS AND BATTERY DISCHARGE) OR
      (BATTERY < 4.7 VOLTS AND BATTERY CHARGE    ) OR
      (BATTERY > 7.0 VOLTS                       ) OR
      CAN'T PREVENT LOW BATTERY INTERRUPT WHILE BATTERY SELECTED THEN
         BATTERY DISCHARGE = OFF
         BACKLIGHT = OFF
         LOW BATT FLAG = ON
         BEEP
         RESET BATTERY TIMER TO 11 HOURS
         IF OFF CHARGE THEN SELECT OTHER BATTERY
   ENDIF
ENDFOR
IF BOTH BATTERIES ARE GOOD OR ON A CHARGER THEN
   LOCKUP TIMER = 10 MINUTES
ENDIF
IF LOCKUP TIMER = 0 OR BOTH BATTERIES ARE BAD THEN DELAY 5 SECONDS
UNTIL LOCK UP TIMER <> 0 OR ONE BATTERY IS GOOD
```

ADDITIONS TO IPMQNAP PROMPT SEQUENCE

After the version number display, IPMQNAP will attempt to auto-chain to an application (as does the 121 version IPMONAP).

If the chain fails, the 'SET TIME?' sequence will begin followed by the 'RUN PROGRAM?' sequence.

The ability to download programs and/or data files has been added at the end of the loop that inquires which program the user wishes to run.

Following the Telecom function, the updated battery subroutine will be executed. It causes the batteries to be discharged and recharged which will extend their life and run-time.

121XL/141 SYSTEM STATUS SUBROUTINE

The purpose of this subroutine is to provide the user with information regarding system operation. The function will be entered optionally from any prompt where the standard input routine (IPMQGIP, ALIAS "INPUT") is used. The SRCH/FIND key has been selected as the key to cause input to call this routine. If the SRCH/FIND key is allowed by the application, it will perform normally. If it is not allowed by the application, it will initiate the system status function. The subroutine takes no parameters, and may be called from within any application.

All prompts within the subroutine will accept either an enter key to continue, or a skip key to return to the application.

Language customization may be achieved by making a copy of the standard module, changing the prompts, and linking the new module directly to the application with a private copy of input. (However, the English language version will continue to execute at power up and when the monitor 'IPMQNAP' is in control.)

DATE AND TIME DISPLAY

Since a user will be likely to use this function to display the date and time, these have been placed first. They will not be continuously updated as this prevents the unit from powering down to save power. The prompt also will not allow updating of these fields as this may lead to cheating on time stamping during application execution. The month will be displayed as an abbreviation to avoid problems with
numeric presentation formats (YY/MM/DD, MM/DD/YY, DD/MM/YY,...).

<DATE  JAN 10,1985>
<TIME  09:00:00 AM>

*******************************************************************
Specific information about the batteries is displayed on the next two
screens. The current voltage and state are displayed on the first
line. The amount of charge time required for a full charge is on the
second line.

SCREEN 1
<MAIN 5.2V STATUS>
<10:32 TO MAX CHG>

Where status is based upon

```
BATTERIES*           *TIMER*VOLTS*VOLTS*
SELECTED *DISCHARGE* = 0 *> 6.2*< 4.7*STATUS* MEANING
---------*----------*-----*-----*-----*------*----------------------
BACKUP   *    ?     *  ?  *  ?  *  ?  *LOW   * TOO LOW TO USE, NO CHARGER
MAIN ONLY*    ?     *  ?  *  ?  *  ?  *ON    * IN USE
NEITHER  *   YES    *  ?  *  ?  *  ?  *DISCHG* CYCLING BATTERIES
NEITHER  *   NO     * YES *  ?  *  ?  *READY * NOT IN USE, FULL CHARGE
NEITHER  *   NO     * NO  * YES *  ?  *HIGH  * USABLE, TOO HIGH TO CHARGE
NEITHER  *   NO     * NO  * NO  * YES *LOWCHG* TOO LOW TO USE, CHARGING
NEITHER  *   NO     * NO  * NO  * NO  *CHARGE* USABLE, CHARGING
```

SCREEN 2
<BACK 5.2V STATUS>
<10:32 TO MAX CHG>

WHERE STATUS IS BASED UPON

```
BATTERIES*           *TIMER*VOLTS*VOLTS*
SELECTED *DISCHARGE* = 0 *> 6.2*< 4.7*STATUS* MEANING
---------*----------*-----*-----*-----*------*----------------------
BOTH     *    ?     *  ?  *  ?  *  ?  *LOW   * TOO LOW TO USE, NO CHARGER
BACK ONLY*    ?     *  ?  *  ?  *  ?  *ON    * IN USE
MAIN ONLY*    ?     *  ?  *  ?  *  ?  *READY * NOT IN USE, NO CHARGER
NEITHER  *   YES    *  ?  *  ?  *  ?  *DISCHG* CYCLING BATTERIES
NEITHER  *   NO     * YES *  ?  *  ?  *READY * NOT IN USE, FULL CHARGE
NEITHER  *   NO     * NO  * YES *  ?  *HIGH  * USABLE, TOO HIGH TO CHARGE
NEITHER  *   NO     * NO  * NO  * YES *LOWCHG* TOO LOW TO USE, CHARGING
NEITHER  *   NO     * NO  * NO  * NO  *CHARGE* USABLE, CHARGING
```

The status of the charger is given in the next screen. The status and
voltage of the charger are displayed on the first line. The temperature
and charge duty cycle is on the second line. The duty cycle is governed
by the temperature. When it gets too hot or cold, the duty cycle will
drop from 100%. If a duty cycle of 0% is indicated, no charging of the
batteries will take place.

<STA CHARGER 15V >
<  20C IS DTY% OK>

WHERE STA IS DEFINED AS:

OFF IF VOLTAGE < 10
BAD IF VOLTAGE > 20
ON OTHERWISE

Where DTY% is the allowable charger duty cycle and is a function of the
temperature. The function is supplied by electrical engineering and
implemented in the system capsule.
*******************************************************************

The final screens display the status of the memory error correction circuitry. There are three possibilities with this circuitry.

1) NO ERRORS DETECTED.                     <NO MEMORY ERRORS>

2) CORRECTABLE MEMORY ERRORS.              <123 MEMORY ERRS >
   MAXIMUM COUNT DISPLAYED IF              <(MAXIMUM COUNT) >
   255 CORRECTABLE ERRORS                  <LAST ADDR:102343>
   DETECTED.  (TWO SCREENS)                <CORRECTED       >

3) UNCORRECTABLE MEMORY ERRORS.            <123 MEMORY ERRS >
   (TWO SCREENS)                           <REPAIR THIS UNIT>
                                           <LAST ADDR:102343>
                                           <UNCORRECTABLE   >

BATTERY CONDITIONING SUBROUTINE

This subroutine has been based upon PSBAT1P written for the 121. It must however condition the two batteries separately. This causes the information presented on the screen to be in a different format. The subroutine is called by IPMQNAP upon powerup and may be called by an application (no parameters).

The first prompt asks user if he wishes to perform the battery routines.

<BATTERY TEST?   >

The skip key will cause the subroutine to return without taking any further action. The enter key will bring the user to the next prompt to ask if capacity is to be measured.

<CAPACITY TEST?  >

A skip at this prompt will cause the subroutine to begin with the battery discharge phase for both batteries. If enter is pressed instead, the subroutine will begin with a precharge phase so that the capacity of the completely charged batteries is measured.

Information about both batteries will be placed upon the screen during this phase. The keyboard is disabled at this point to prevent interruption of this critical section of code.

<MN STA 5.2V TIM>      MAIN BATTERY STATUS
<BK STA 5.2V TIM>      BACKUP BATTERY STATUS

Where STA is updated separately for each battery and represents

PRE = precharging battery before the discharge phase
   DIS = discharging the battery
   RCH = Recharging the battery after the discharge phase Where TIM represents the battery capacity timer kept in minutes by the system capsule. It will count down as the battery obtains capacity, and count up as the battery is being drained. If the unit is removed from the charger during this phase, it will complain for approximately 30 seconds, then abort the test.

<CHARGER          >   Accompanied by periodic beeping until charger or
                      30 seconds.
<FUNCTION ABORTED>    If no charger after 30 seconds
<         NO CHARGER> Enter key here will exit subroutine As each battery completes it's discharge, the status line for it will be
replaced with a final message. If a capacity test was being performed,
the battery capacity timer will be displayed. Otherwise, a message
indicating completion will appear. When a final message appears for
both batteries, an enter key will return the user to the battery test
prompt. (Note: Complete recharging of the batteries has not taken
place. Only enough charge to bring the batteries above 4.7 volts has
occured. The user should not remove the charger until the low batt flag
on the display has been extinguished.)

```
<MN CAPACITY  621>     If capacity test performed
<BK CAPACITY  621>

<MN COMPLETE     >     If capacity test not performed
<BK COMPLETE     >
```

While several preferred embodiments have been illustrated and described in detail, it will be apparent to those skilled in the art that many changes and modifications may be made without departing from the disclosed invention in its broader aspects; and it is intended that the appended claims cover all such changes and modifications as fall within the true spirit and scope of the contribution to the art made hereby.

What is claimed is:

1. In a system including power supply means for supplying a regulator input voltage, automatic voltage regulator means having power input means coupled with said power supply means for receiving the regulator input voltage, having power output means for supplying a regulator output voltage, and being automatically operable to maintain a selected value of said regulator output voltage at said power output means for a normal range of values of said regulator input voltage, said automatic voltage regulator means comprising operational amplifier means providing a regulator signal controlling regulator output voltage so as to maintain the selected value of said regulator output voltage for the normal range of values of said regulator input voltage, said operational amplifier means causing said regulator signal to progressively change in amplitude to maintain said regulator output voltage at the selected value as the value of said regulator input voltage is progressively decreased within said normal range, and causing said regulator signal to reach a distinctive limit range as the regulator input voltage falls below a given minimum value, and signalling means coupled with said operational amplifier means and responsive to said regulator signal for supplying a low power signal to an external circuit when the regulator signal reaches said distinctive limit range.

2. A system according to claim 1, with said operational amplifier means comprising an operational amplifier having an output supplying the regulator signal and supplying a saturation value as the regulator signal when the regulator input voltage falls below the given minimum value.

3. A system according to claim 2, with said signalling means comprising logic means connected with the output of said operational amplifier for supplying a first discrete logic signal when the regulator signal corresponds to said normal range of values of said regulator input voltage and for supplying a second discrete logic signal level distinct from said first logic signal level when the regulation signal has said saturation value.

4. A system according to claim 1, with said operational amplifier means comprising an integrated circuit having a first operational amplifier forming part of said automatic voltage regulator means and supplying said regulation signal at its output, and a second operational amplifier forming part of said signalling means and having an input coupled with an output of said first operational amplifier.

5. A system according to claim 1, with said operational amplifier means supplying a regulator signal whose voltage amplitude varies in a range from about three-tenths volt to about eight-tenths volt for a normal range of values of said regulator input voltage at said input means and which regulator signal rises to a voltage value of at least about 2.7 volts when the value of the regulator input voltage falls below said minimum value.

6. A system according to claim 5, with said operational amplifier means having input means switchable to cause said operational amplifier means to selectively maintain a regulated output voltage of about 4.65 volts or a regulated output voltage of about 2.5 volts.

7. A system according to claim 6, said automatic voltage regulator means having a plurality of individual current supply paths for coupling with respective power supply sources and having respective current regulator means therein, and said operational amplifier means comprising a common operational amplifier having an output supplying said regulator signal and coupled to each of said current regulator means for controlling the same and for causing said regulator signal to reach said distinctive limit range when the respective power supply sources supply regulator input voltages to the respective individual current supply paths below respective minimum values.

8. A system according to claim 7, with said common operational amplifier being switchable to selectively maintain the respective regulated output voltages of about 4.65 volts or of about 2.5 volts, said common operational amplifier in each case maintaining the selected output voltage by means of the regulator signal supplied at its output and in each case causing said regulator signal to reach a distinctive limit range for actuating the same signalling means.

9. A system according to claim 1, said automatic voltage regulator means having a plurality of individual current supply paths for coupling with respective power supply sources and having respective current regulator means therein, and said operational amplifier means comprising a common operational amplifier having an output supplying said regulator signal and coupled to each of said current regulator means for controlling the same and for causing said regulator signal to reach said distinctive limit range when the respective power supply sources supply regulator input voltages to the respective individual current supply paths below respective minimum values.

10. A system according to claim 9, with said common operational amplifier being switchable to selectively maintain respective regulated output voltages of about 4.65 volts or of about 2.5 volts, said common operational amplifier in each case maintaining the selected output voltage by means of the regulator signal supplied at its output and in each case causing said regulator signal to reach a distinctive limit range for actuating the same signalling means.

11. A system according to claim 1, with said operational amplifier means supplying the regulator signal in the form of a voltage having a normal limit voltage, for values of said regulator input voltage within said normal range, and supplying a saturation voltage value as said regulator signal when the regulator input voltage falls below the minimum value, which saturation voltage value has a ratio relative to the normal limit voltage of at least two to one.

12. A system according to claim 11, with said saturation voltage value having a ratio relative to the normal limit voltage of at least about three to one.

13. In a system including a plurality of power supply means for supplying respective power supply voltages, a plurality of individual current supply paths connected with the respective power supply means and having respective current regulator means therein, and a common operational amplifier means having output means coupled to each of said current regulator means and supplying a common control signal which has a normal range so long as one of the power supply voltages is above a given minimum value and which reaches a saturation value when the respective power supply voltages are below their respective minimum values, for signalling a low power condition.

14. A system according to claim 13, with switch means controlling the respective current supply paths and operative for selectively switching the respective current supply paths to a restricted current flow condition independently of the common operational amplifier means.

15. A system according to claim 13, with said operational amplifier means supplying a common control voltage having a normal limit voltage, and supplying a saturation voltage value when the respective power supply voltages are below their respective minimum values, which saturation voltage value has a ratio relative to the normal limit voltage of at least two to one.

16. A system according to claim 13, with said operational amplifier means supplying a common control voltage having a normal range including a given normal limit voltage, and supplying a saturation voltage value when the respective power supply voltages are below their respective minimum values, which saturation voltage value has a ratio relative to the normal limit voltage of at least about three to one.

17. A system according to claim 13, with switch means controlling activation of the respective current supply paths, and responsive to the common control signal reaching said saturation value to automatically activate a plurality of the current supply paths.

18. In a system including rechargeable battery means for supplying a normal range of battery voltge values during battery operation, automatic voltage regulator means energized by said rechargeable battery means during battery operation, having power output means for supplying external circuitry, and having power input means coupled with said rechargeable battery means for receiving battery voltage therefrom, and being automaticlly operable for supplying a regulated output voltage at said power output means, said automatic voltage regulator means producing a regulator signal which progressively increases as battery voltage decreases during battery operation and which reaches a distinctive limit range as battery voltage is reduced below a given minimum value, and signalling means coupled with said automatic voltage regulator means for supplying a low power signal to an external circuit when the regulator signal reaches said distinctive limit range.

19. A system according to claim 18, with said automatic voltage regulator means comprising an operational amplifier supplying the regulator signal in the form of a control signal for controlling output voltage at said power output means of said regulator means, such control signal having a normal control range corresponding to said normal range of battery voltage values and having a saturation value which is reached when battery voltage falls below the given minimum value.

20. A system according to claim 18, with an integrated circuit having a first operation amplifier forming part of said automatic voltage regulator means with regulator output means thereof supplying said regulator signal, and a second operational amplifier forming part of said signalling means and having an input means coupled with the regulator output means of said first operational amplifier and having output means supplying said low power signal.

21. A system according to claim 18, with said rechargeable battery means providing a normal range of battery voltage values of from about 4.65 volts to about 7.5 volts, and said automatic voltage regulator means maintaining the output voltage at about 4.65 volts for battery voltage values down to about 4.7 volts.

22. A system according to claim 18, with battery charger means for supplying charging current to said rechargeable battery means and for supplying energizing power to said automatic regulator means in a battery charging mode, said automatic regulator means in said battery charging mode being responsive to voltage from said battery charging means, and causing said regulator signal to increase to a distinctive limit range and causing said signalling means to supply the low power signal when the voltage supplied by the battery charger means falls below a minimum value during battery charging mode.

23. A system according to claim 22 with said automatic voltage regulator means having respective individual battery-energized and charger-energized current supply paths with respective individual regulator means therein, and having respective individual power input means for receiving battery voltage and voltage from the battery charger means, respectively, said automatic voltage regulator means supplying said regulator signal to each of said individual regulator means to maintain a selected output voltage at said power output means both during battery operation and in battery charging mode.

24. A system according to claim 23, with switch means controlling the battery-energized current supply path and being automatically switched to a battery operation mode in response to the low power signal such that the battery-energized current supply path becomes responsive to the regulator signal when the voltage at the power input means of the charger energized current supply path is below the minimum value in said battery charging mode.

25. A system according to claim 24, with said automatic voltage regulator means having a further individual power input means for receiving voltage from a further power source, and having a further current supply path connected with the further power input means, further switch means controlling said further current supply path, and being concurrently switched to an active mode where the further current supply path is responsive to said regulator signal when the voltage at the power input means of the charger energized current supply path is below the minimum value in the battery charging mode.

26. A system according to claim 25, with said switch means being individually actuatable during normal operation for selectively activating said battery energized current supply path and said further current supply path such that the regulator signal selectively controls the output voltage as produced by the rechargeable battery means and as produced by a further power source coupled with said further individual power input means.

27. In a system including a plurality of battery means for supplying respective individual battery voltages, a plurality of individual current supply paths coupled with the respective battery means and having respective current regulator means therein for maintaining a selected output voltage, and a common operational amplifier means having output means coupled to each of said current regulator means and supplying a common control signal which has a normal range so long as one of the battery voltages is in an operating range such that the associated current regulator means maintains the selected output voltage and which common control signal reaches a saturation value when the respective battery voltages are below respective minimum values, for signalling a low power condition.

28. A system according to claim 27, with switch means controlling the respective current supply paths and operative for selectively switching the respective current supply paths to a restricted current flow condition independently of the common operational amplifier means.

29. In a system including battery means for supplying a normal range of battery voltages during battery operation, automatic voltage regulator means energized by said battery means during battery operation, having power output means for supplying regulated output power, and having power input means coupled with said battery means for receiving battery voltage therefrom, and being automatically operable for supplying a regulated output voltage at said power output means, said automatic voltage regulator means producing a regulator signal which progressively changes in amplitude in a given sense as battery voltage decreases during battery operation and which changes further in the given sense to reach a distinctive limit range as battery voltage is reduced below a given minimum value, and signalling means coupled with said automatic voltage regulator means for supplying a low power signal to an external circuit when the regulator signal reaches said distinctive limit range.

30. A system according to claim 29, with said automatic voltage regulator means comprising an operational amplifier supplying the regulator signal and causing the amplitude of the regulator signal to progressively change in the sense of increasing amplitude as a selected output voltage is maintained with decreasing battery voltage in said normal range, and causing said regulator signal to further markedly increase to a saturation value as battery voltage falls below the given minimum value.

31. A system according to claim 29, with an integrated circuit having a first operational amplifier means forming part of said automatic voltage regulator means and providing regulator output means supplying said regulator signal, and a second operational amplifier means forming part of said signalling means and having an input means coupled with the regulator output means of said first operational amplifier means and having output means supplying said low power signal.

32. In a system including a plurality of power supply means for supplying respective power supply voltages and comprising a rechargeable battery means and a battery charger means, a plurality of individual current supply paths respectively energizable by the battery means and the charger means, and having respective current regulator means therein, and a common operational amplifier means having output means coupled to each of said current regulator means and supplying a common control signal which progressively changes over a normal range from a first value to a second value with progressively decreasing power supply voltage above a given minimum value and which reaches a distinctive value markedly beyond said second value when the respective power supply voltages are below respective minimum values, for signalling a low power condition.

33. A system according to claim 32, with switch means controlling the respective current supply paths and operative for selectively switching the respective current supply paths to a restricted current flow condition independently of the common operational amplifier means.

34. A system according to claim 32, with said common operational amplifier means supplying a common control voltage having a normal limit voltage representing said second value of said normal range, and supplying a saturation voltage value as the distinctive value when the respective power supply voltages are below their respective minimum values, which saturation voltage value has a ratio relative to the normal limit voltage of at least two to one.

35. A system according to claim 32, with said common operational amplifier means supplying a common control voltage having a normal range including a given normal limit voltage representing said second value, and supplying a saturation voltage value as the distinctive value when the respective power supply voltages are below their respective minimum values, which saturation voltage value has a ratio relative to the normal limit voltage of at least about three to one.

36. A system according to claim 32, with switch means selectively controlling activation of the current supply path energized by said battery means for deactivating such current supply path in a battery charging mode, and said switch means being responsive to the common control signal reaching said distinctive value during the battery charging mode to automatically activate the current supply path energized by the battery means.

37. In a system including power supply means for supplying a power supply voltage, automatic voltage regulator means having input means coupled with said power supply means and automatically operable for maintaining a regulated output voltage, said automatic voltage regulator means producing a regulator signal which progressively changes in a normal range from a first value to a second value as the power supply voltage progressively decreases in voltage value within an operating range and reaches a distinctive regulator signal limit range markedly beyond said second value as power supply voltage is reduced below a given minimum value, and signalling means coupled with said automatic voltage regulator means for supplying a low power signal to an external circuit when the regulator signal reaches said distinctive regulator signal limit range.

38. A system according to claim 37, with said automatic voltage regulator means comprising an operational amplifier means supplying the regulator signal for maintaining a selected power output voltage from said regulator means, said operational amplifier means providing a saturation value as said regulator signal when power supply voltage from the power supply means falls below the given minimum value.

39. A system according to claim 38, with an integrated circuit providing said operational amplifier means of said automatic voltage regulator means, and providing a second operational amplifier means forming said signalling means, said second operational means having an input means coupled with said first operational amplifier means for actuation by said saturation value of said regulator signal to supply said low power signal.

40. A system according to claim 38, with said operational amplifier means supplying a normal limit voltage as said second value of said regulator signal and supplying a saturation voltage value when the power supply voltage is below the minimum value, which saturation voltage value has a ratio relative to the normal limit voltage of at least two to one.

41. A system according to claim 37, with said automatic voltage regulator means supplying a given normal limit voltage as said second value, and supplying a saturation voltage value when the power supply voltage is below the minimum value, which saturation voltage value has a ratio relative to the normal limit voltage of at least two to one.

42. A system according to claim 37, with said automatic voltage regulator means supplying a given normal limit voltage as said second value, and supplying a saturation voltage value when the power supply voltage is below the minimum value, which saturation voltage value has a ratio relative to the normal limit voltage of at least about three to one.

43. A system according to claim 42, with said automatic voltage regulator means in said normal range supplying a regulator signal voltage which progressively changes from a first voltage value to a second voltage value with the first and second voltage values having a ratio of at least two to one.

44. A system according to claim 37, with said automatic voltage regulator means in said normal range supplying a regulator signal voltage which progressively changes from a first voltage value to a second voltage value, with the first and second voltage values having a ratio of at least two to one.

* * * * *